US010340232B2

United States Patent
Aoki et al.

(10) Patent No.: US 10,340,232 B2
(45) Date of Patent: Jul. 2, 2019

(54) WIRING SUBSTRATE

(71) Applicant: SHINKO ELECTRIC INDUSTRIES CO., LTD., Nagano-shi, Nagano-ken (JP)

(72) Inventors: Toshiaki Aoki, Nagano (JP); Shinji Nakazawa, Nagano (JP)

(73) Assignee: SHINKO ELECTRIC INDUSTRIES CO., LTD. (JP)

( * ) Notice: Subject to any disclaimer, the term of this patent is extended or adjusted under 35 U.S.C. 154(b) by 0 days.

(21) Appl. No.: 15/975,990

(22) Filed: May 10, 2018

(65) Prior Publication Data
US 2018/0374803 A1    Dec. 27, 2018

(30) Foreign Application Priority Data
Jun. 26, 2017   (JP) ................. 2017-124580

(51) Int. Cl.
*H01L 23/00*    (2006.01)
*H01L 23/64*    (2006.01)
*H01L 23/498*   (2006.01)

(52) U.S. Cl.
CPC ...... *H01L 23/645* (2013.01); *H01L 23/49822* (2013.01); *H01L 23/49838* (2013.01); *H01L 23/49866* (2013.01); *H01L 24/16* (2013.01); *H01L 2224/16227* (2013.01)

(58) Field of Classification Search
CPC ....... H01L 23/645; H01L 23/00; H01L 23/64; H01L 23/498; H01L 23/49838; H01L 23/49866; H01L 23/49822
USPC .......................................... 257/668
See application file for complete search history.

(56) References Cited

U.S. PATENT DOCUMENTS

2018/0075965 A1*   3/2018   Yoshioka ............ H01F 27/2823

FOREIGN PATENT DOCUMENTS

JP    2005183890 A    7/2005

* cited by examiner

Primary Examiner — Chuong A Luu
(74) Attorney, Agent, or Firm — Tarolli, Sundheim, Covell & Tummino LLP

(57) ABSTRACT

A wiring substrate includes a coil wiring and a magnetic layer that is in contact with a lower surface of the coil wiring and includes an opening extending through in a thickness-wise direction. The wiring substrate further includes a first insulation layer covering the coil wiring, an upper surface of the magnetic layer, and a wall surface of the opening and a signal wiring structure formed so that a signal of a semi-conductor element, when mounted on the wiring substrate, travels through the opening of the magnetic layer. The signal wiring structure includes a first wiring portion located on an upper surface of the first insulation layer and a first via wiring located inward from the opening of the magnetic layer and connected to the first wiring portion. The magnetic layer is not in contact with the signal wiring structure.

13 Claims, 23 Drawing Sheets

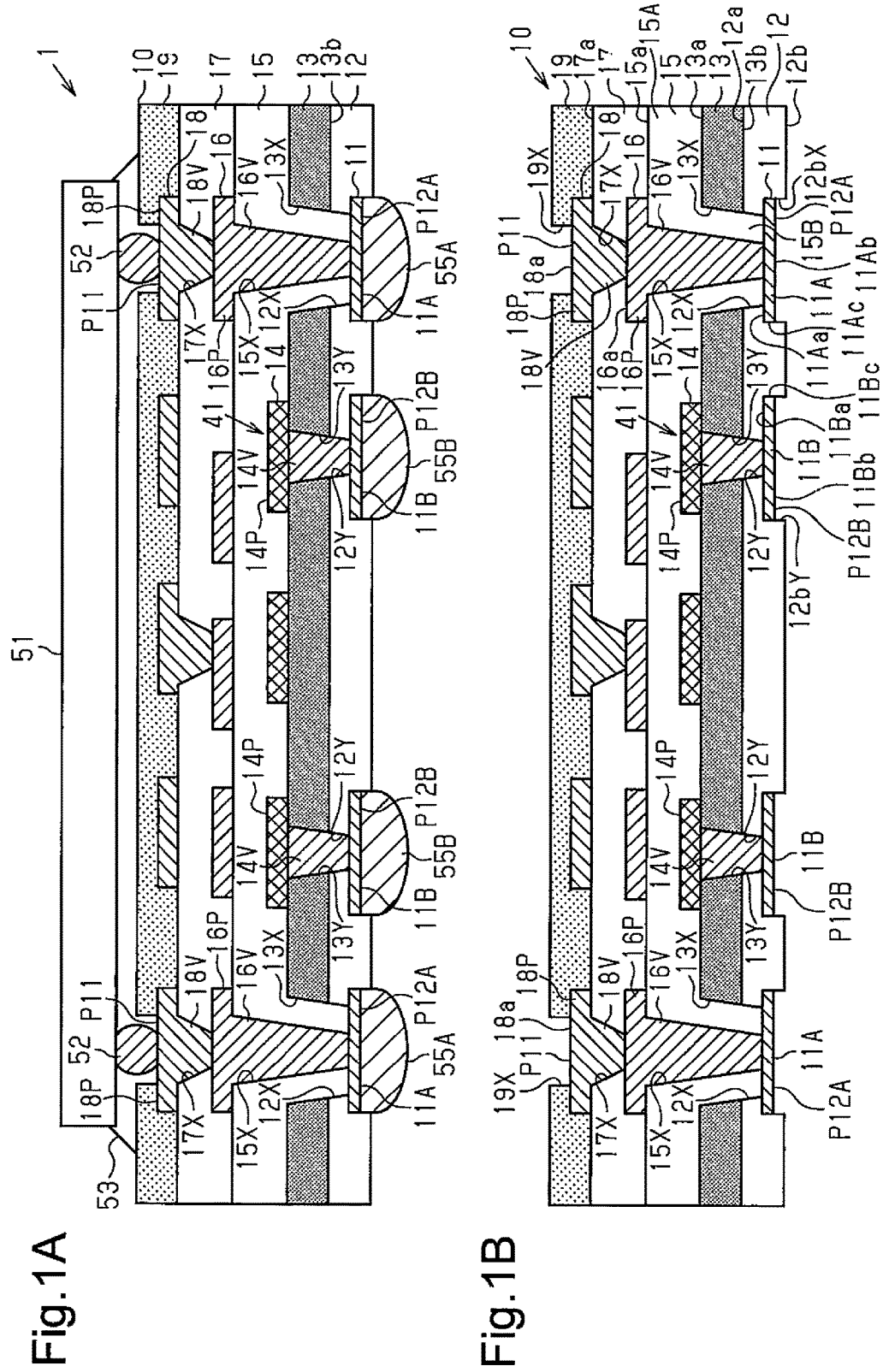

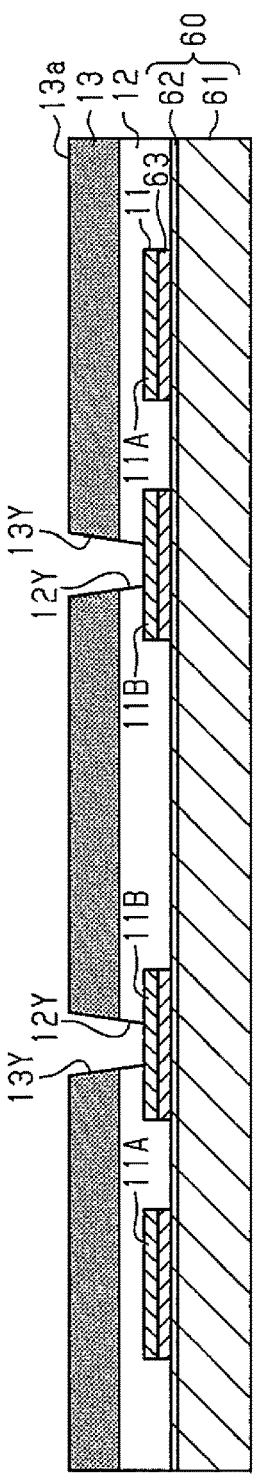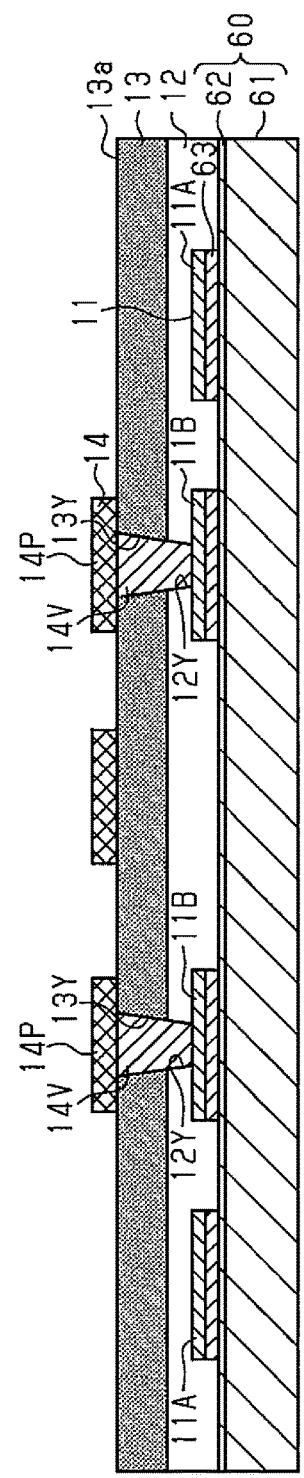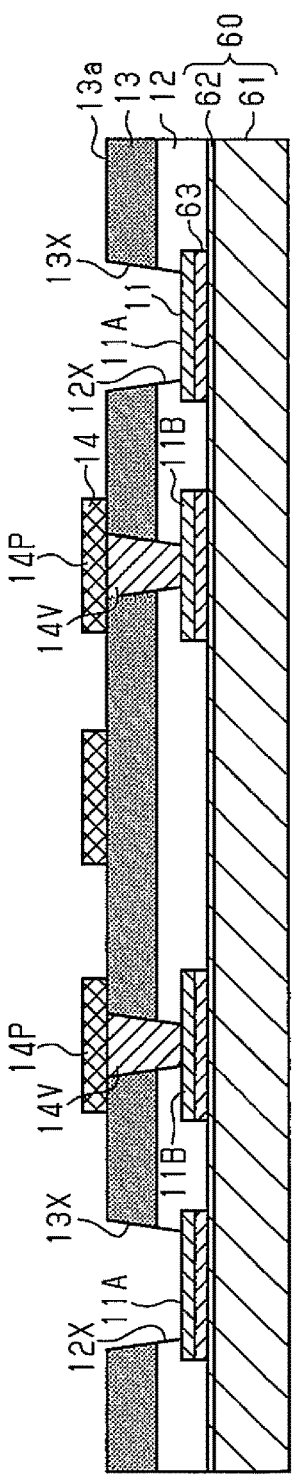

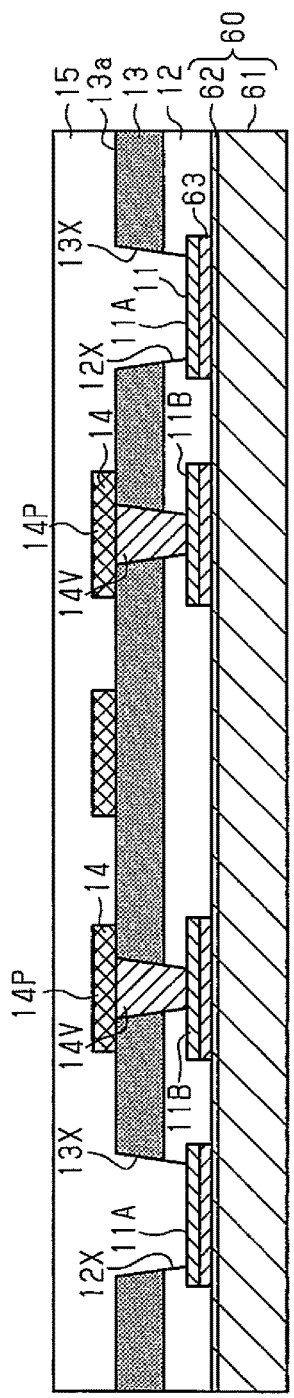
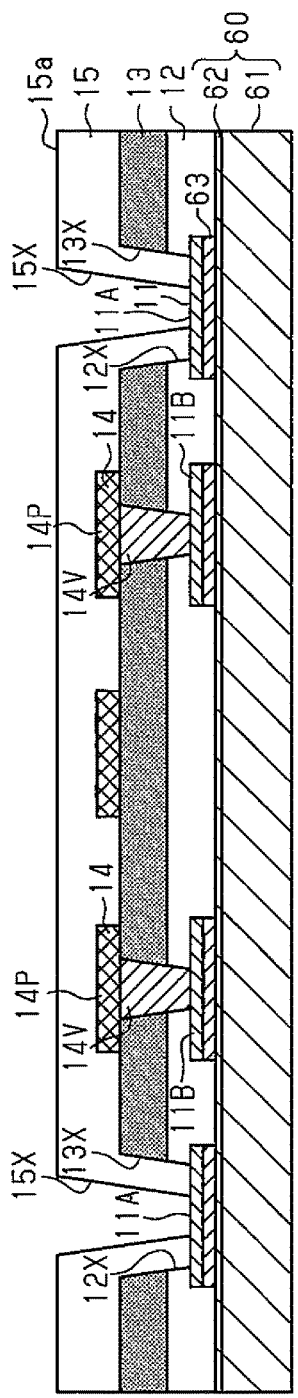
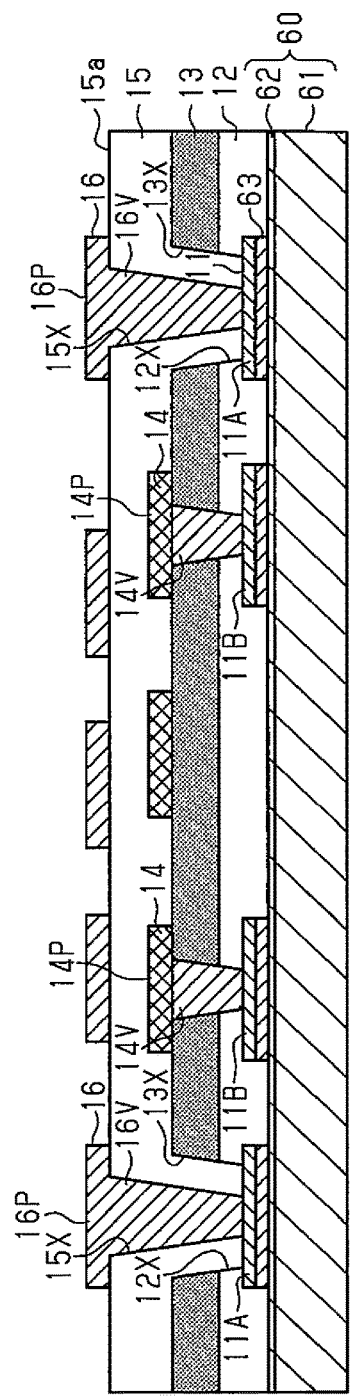
Fig.4A
Fig.4B
Fig.4C

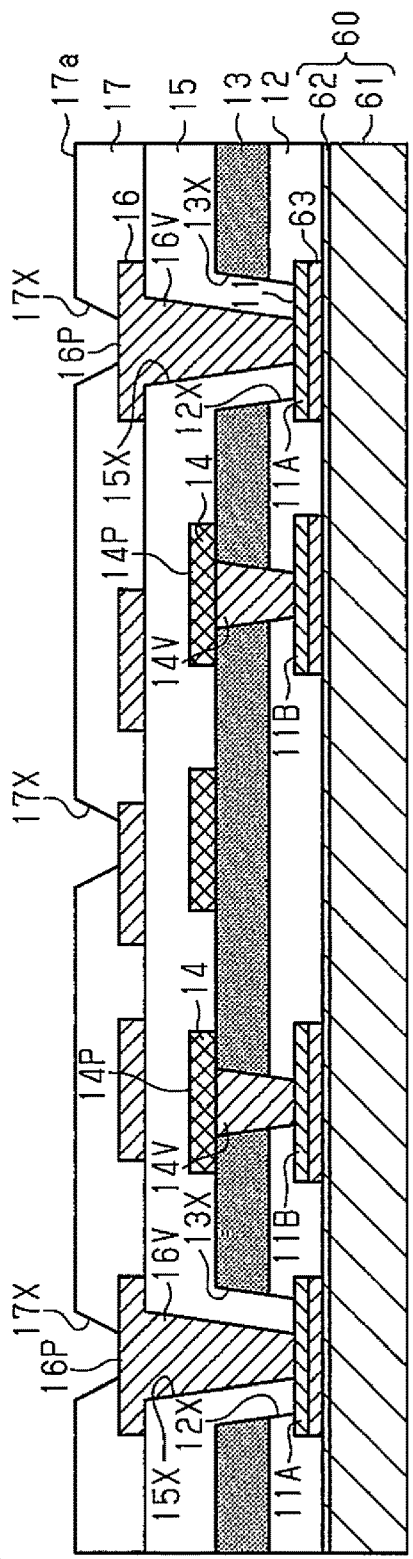
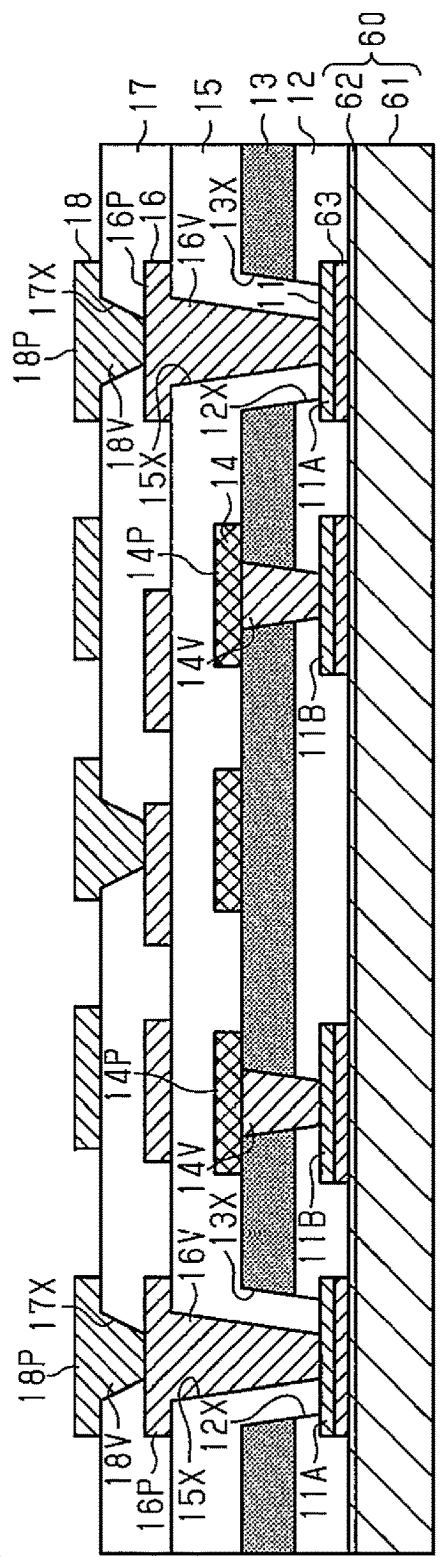
Fig.5A
Fig.5B

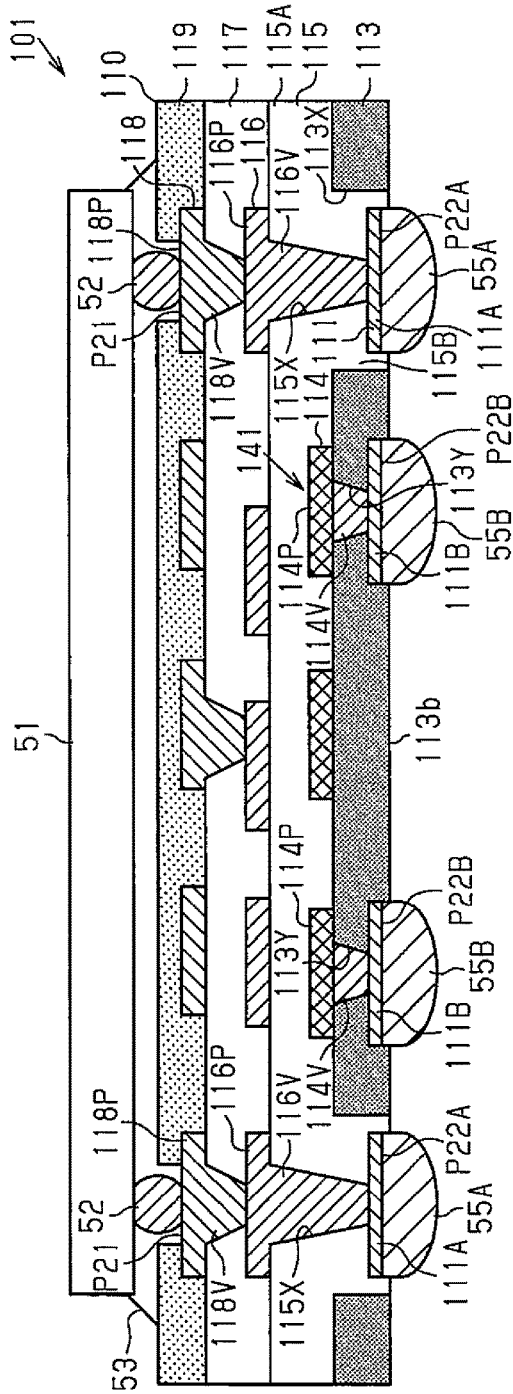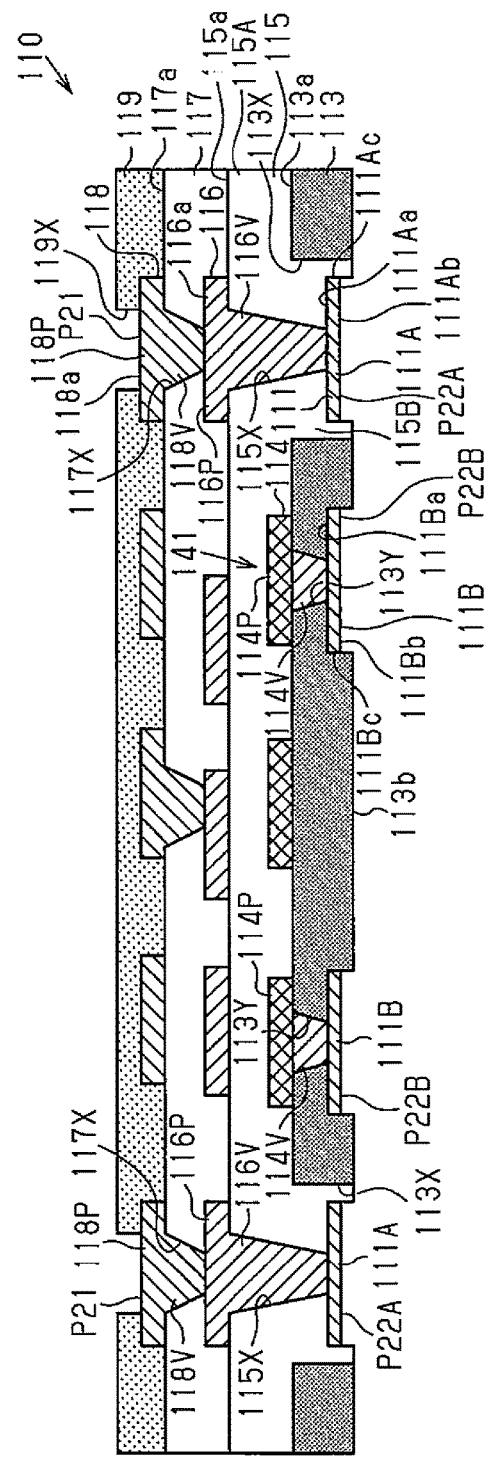

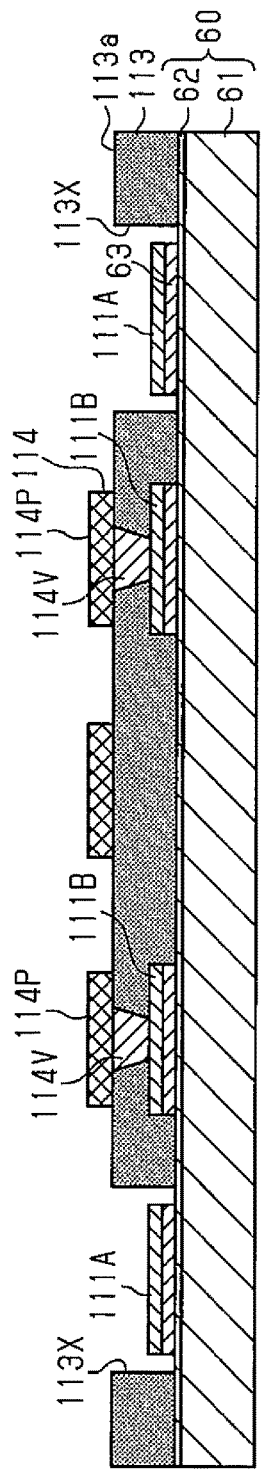
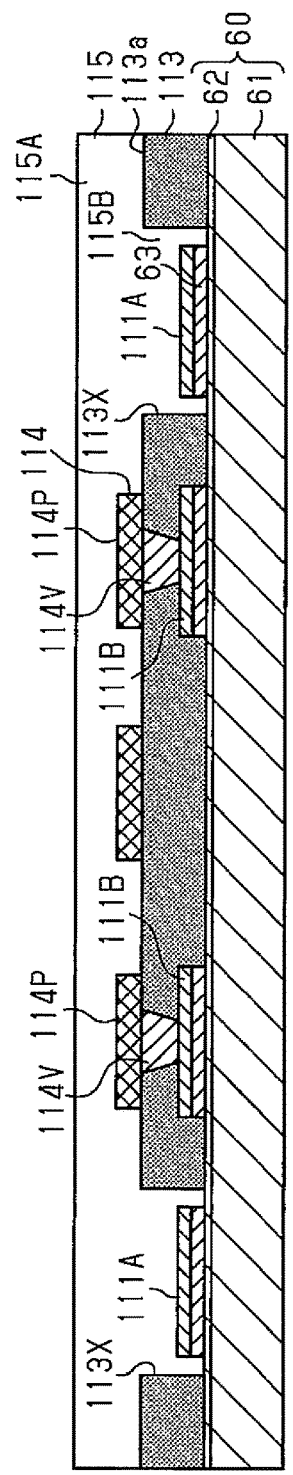
Fig.11A
Fig.11B

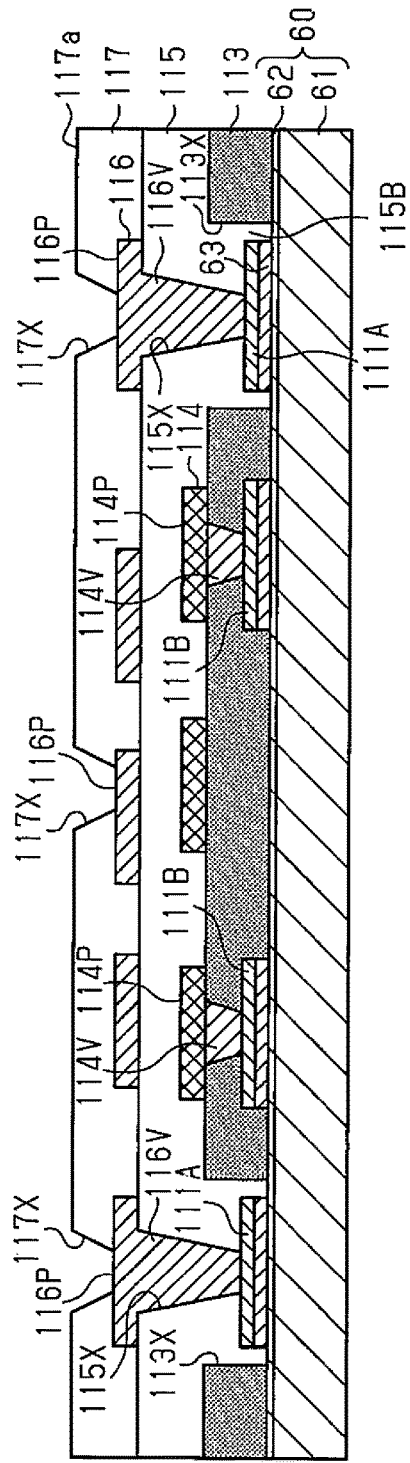
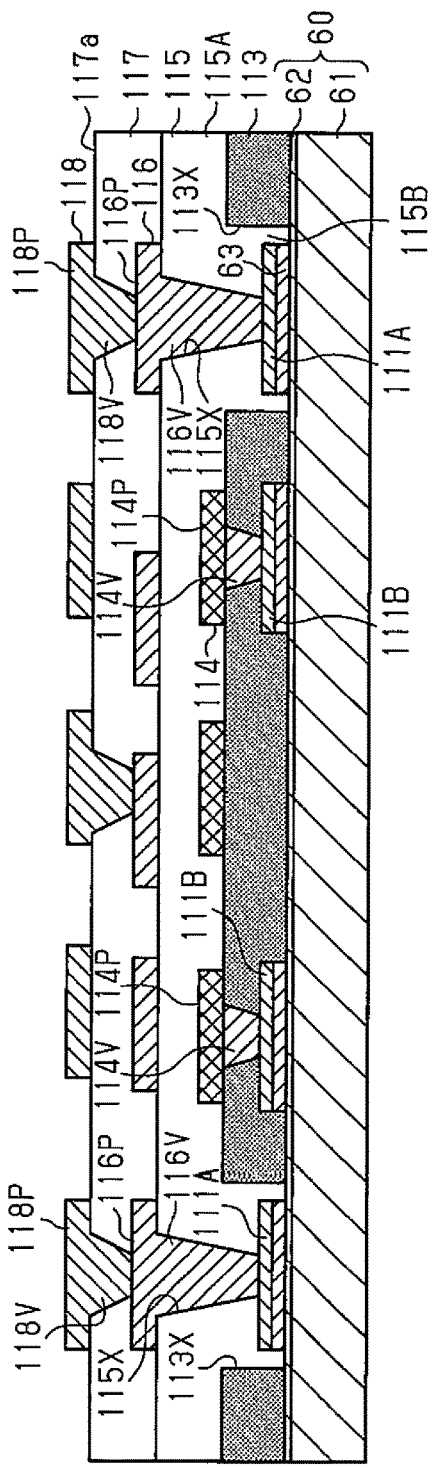
Fig.13A
Fig.13B

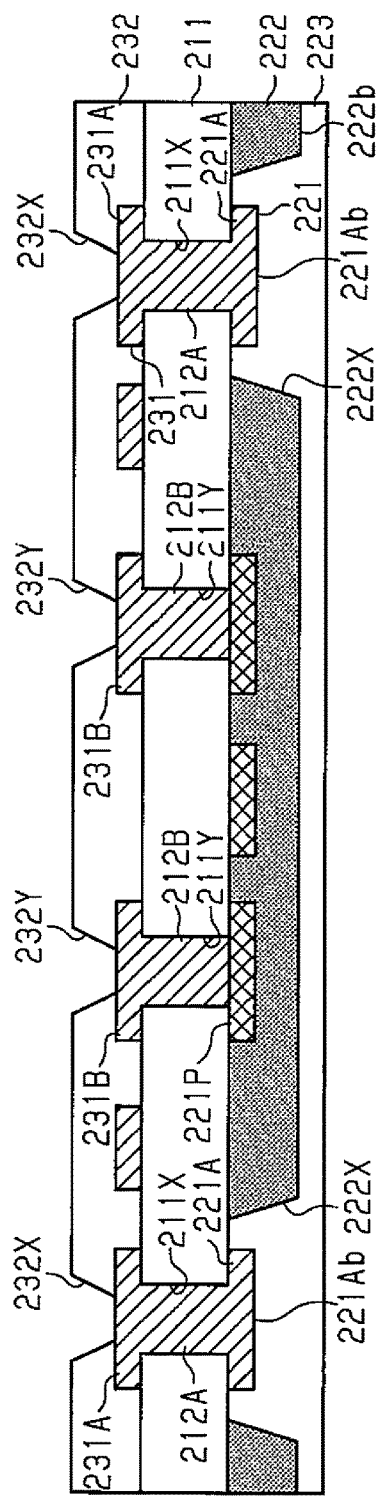
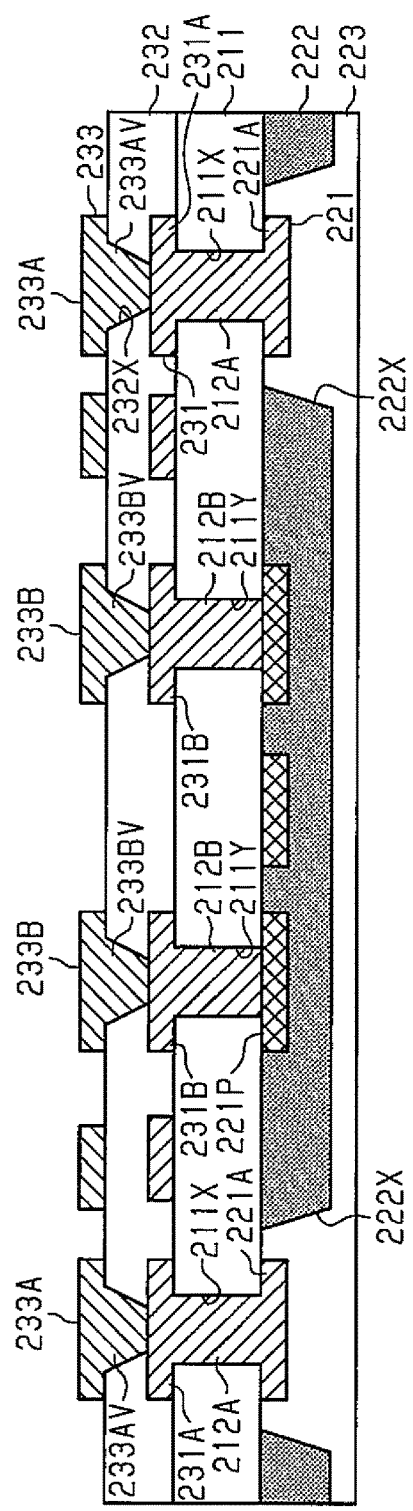
Fig. 17A
Fig. 17B

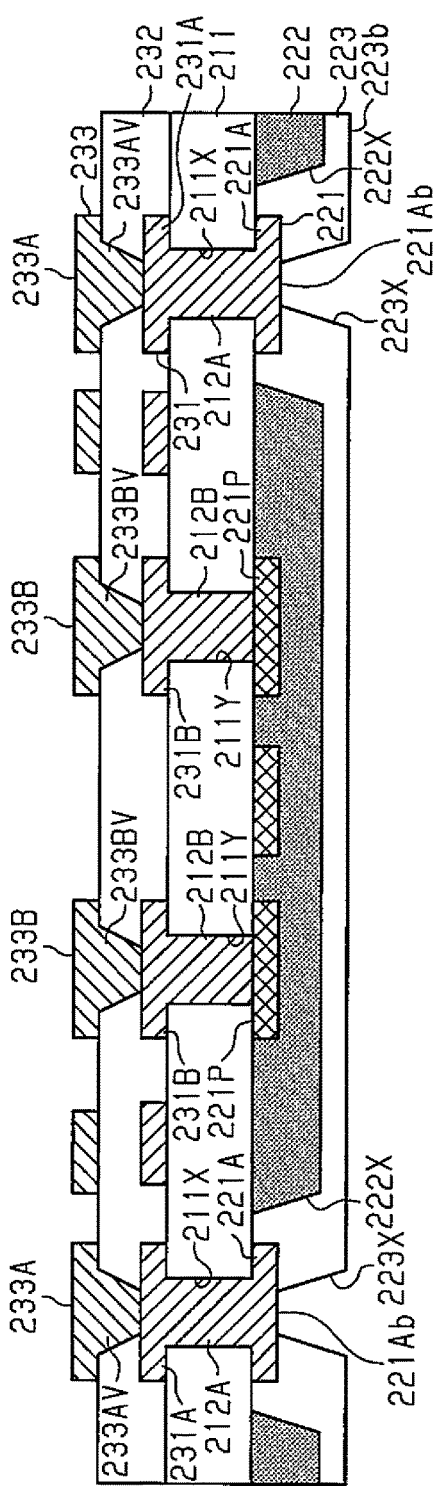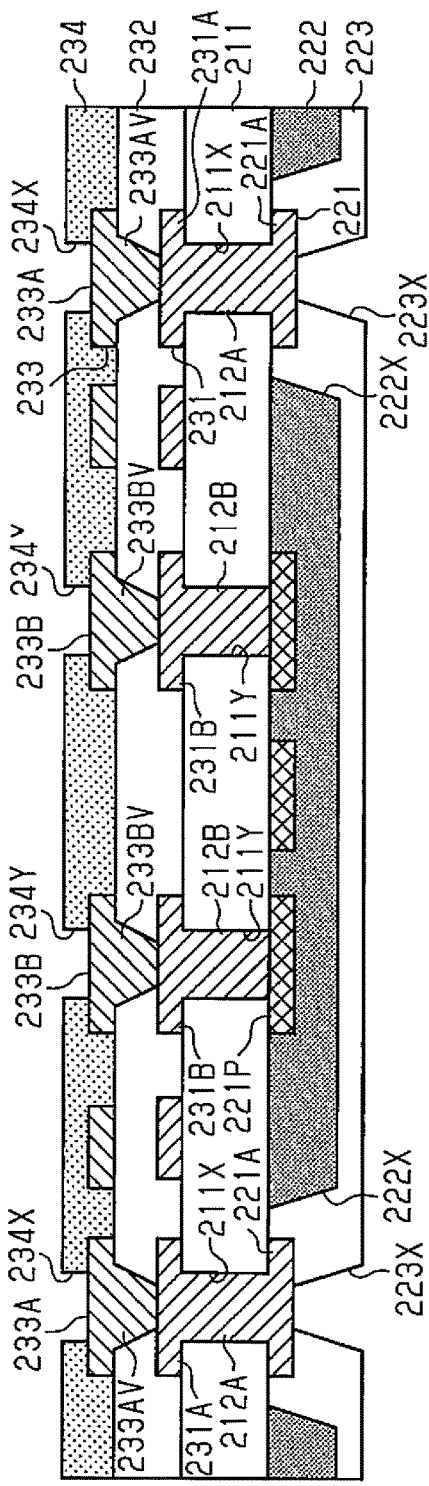

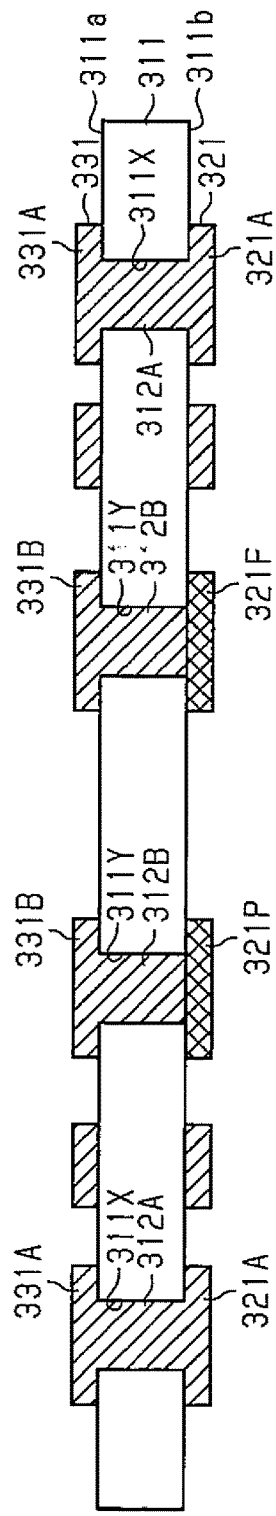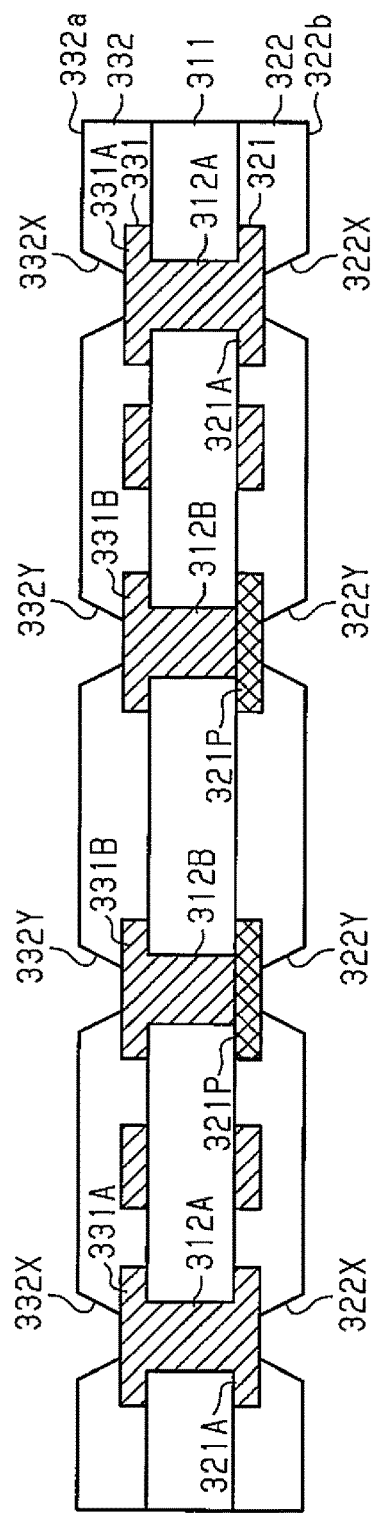

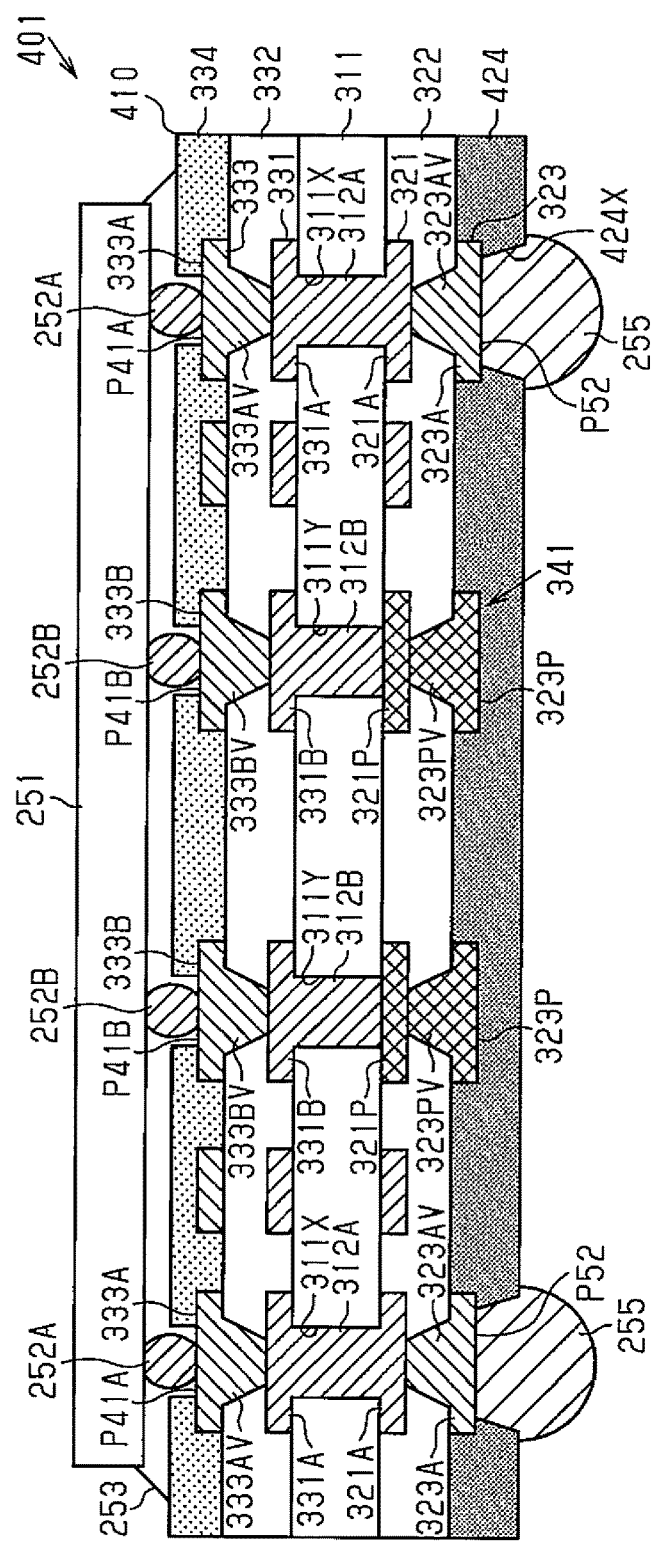
Fig.23A (Comparative Example)

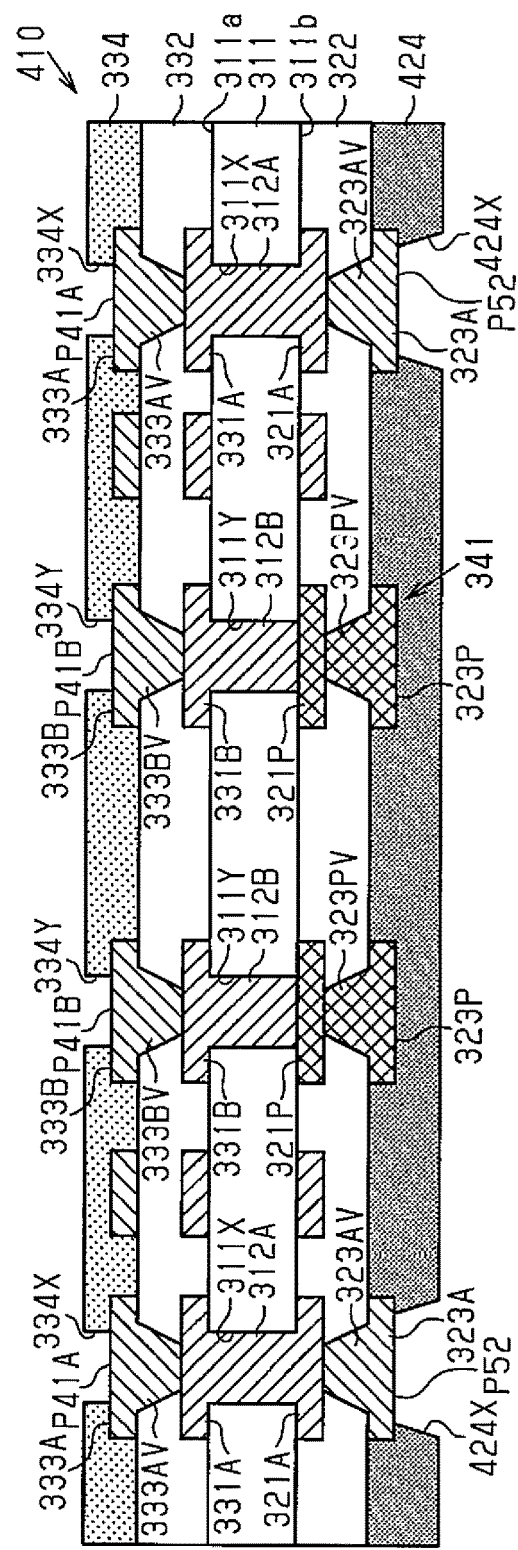
Fig.23B (Comparative Example)

WIRING SUBSTRATE

CROSS-REFERENCE TO RELATED APPLICATIONS

This application is based upon and claims the benefit of priority from prior Japanese Patent Application No. 2017-124580, filed on Jun. 26, 2017, the entire contents of which are incorporated herein by reference.

FIELD

This disclosure relates to a wiring substrate.

BACKGROUND

A semiconductor element is mounted on a wiring substrate. Japanese Laid-Open Patent Publication No. 2005-183890 describes a wiring substrate incorporating a coil.

SUMMARY

There is a demand for a wiring substrate that limits adverse effects on properties of signals.

One embodiment is a wiring substrate. The wiring substrate includes a coil wiring, a magnetic layer, a first insulation layer, and a signal wiring structure. The magnetic layer is in contact with a lower surface of the coil wiring. The magnetic layer includes an opening extending through in a thickness-wise direction. The first insulation layer covers the coil wiring, an upper surface of the magnetic layer, and a wall surface of the opening. The signal wiring structure that transmits a signal of a semiconductor element in the wiring substrate when the semiconductor element is mounted on the wiring substrate. The signal wiring structure is formed so that the signal of the semiconductor element travels through the opening of the magnetic layer. The signal wiring structure includes a first wiring portion located on an upper surface of the first insulation layer and a first via wiring located inward from the opening of the magnetic layer and connected to the first wiring portion. The magnetic layer is not in contact with the signal wiring structure.

Another embodiment is a wiring substrate. The wiring substrate includes an insulation layer including an upper surface and a lower surface, a coil wiring formed on the lower surface of the insulation layer, a magnetic layer covering the lower surface of the insulation layer and the coil wiring and including an opening extending through in a thickness-wise direction, and a signal wiring structure that transmits a signal of a semiconductor element in the wiring substrate when the semiconductor element is mounted on the wiring substrate. The signal wiring structure is formed so that the signal of the semiconductor element travels through the opening of the magnetic layer. The magnetic layer is not in contact with the signal wiring structure.

Other embodiments and advantages thereof will become apparent from the following description, taken in conjunction with the accompanying drawings, illustrating by way of example the principles of the invention.

It is to be understood that both the foregoing general description and the following detailed description are exemplary and explanatory and are not restrictive of the invention, as claimed.

BRIEF DESCRIPTION OF THE DRAWINGS

The embodiments, together with objects and advantages thereof, may best be understood by reference to the following description of the presently preferred embodiments together with the accompanying drawings in which:

FIG. 1A is a schematically cross-sectional view illustrating a semiconductor device including a first embodiment of a wiring substrate;

FIG. 1B is a schematically cross-sectional view illustrating the wiring substrate of FIG. 1A;

FIGS. 2A to 2C, 3A to 3C, 4A to 4C, 5A, 5B, 6A, and 6B are schematically cross-sectional views illustrating steps of manufacturing the wiring substrate of FIG. 1A;

FIG. 9A is a schematically cross-sectional view illustrating a semiconductor device including a second embodiment of a wiring substrate;

FIG. 9B is a schematically cross-sectional view illustrating the wiring substrate of FIG. 9A;

FIGS. 10A to 10C, 11A, 11B, 12A, 12B, 13A, 13B, 14A, and 14B are schematically cross-sectional views illustrating steps of manufacturing the wiring substrate of FIG. 9A;

FIGS. 16A to 16C, 17A, 17B, 18A, and 18B are schematically cross-sectional views illustrating steps of manufacturing the wiring substrate of FIG. 15A;

FIGS. 20A, 20B, 21A, 21B, 22A, and 22B are schematically cross-sectional views illustrating steps of manufacturing the wiring substrate of 19A;

FIG. 23A is a schematically cross-sectional view illustrating a semiconductor device including a comparative example of a wiring substrate; and FIG. 23B is a schematically cross-sectional view illustrating the wiring substrate of FIG. 23A.

DESCRIPTION OF THE EMBODIMENTS

Figure 2A:
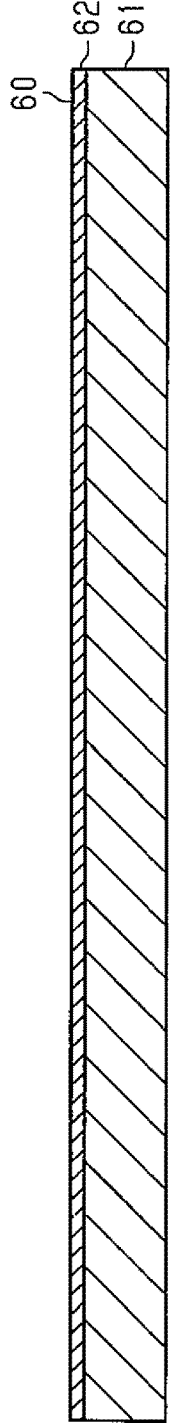

Each embodiment will now be described with reference to the accompanying drawings. Elements in the drawings may be partially enlarged for simplicity and clarity and thus have not necessarily been drawn to scale. To facilitate understanding, hatching lines may not be illustrated or be replaced by shadings in the cross-sectional drawings.

In the specification hereafter, "plan view" refers to a view of a subject taken in a vertical direction (for example, upper-lower direction in FIG. 1A), and "planar shape" refers to a shape of a subject as viewed in the vertical direction.

First Embodiment

The first embodiment will now be described.

As illustrated in FIG. 1A, a semiconductor device 1 includes a wiring substrate 10 and a semiconductor element 51 mounted on the wiring substrate 10.

The semiconductor element 51 is connected to external connection pads P11 of the wiring substrate 10 by external connection terminals 52. The semiconductor element 51 is flip-chip-connected to the external connection pads P11 of the wiring substrate 10. The semiconductor element 51 may be, for example, a logic chip such as a central processing unit (CPU) or a graphics processing unit (GPU) or a memory chip such as a dynamic random access memory (DRAM) or a static random access memory (SRAM). The external connection terminals 52 are, for example, solder bumps or gold bumps. The material of the solder bumps may be, for example, an alloy containing lead, an alloy of tin and gold, an alloy of tin and copper, an alloy of tin and silver, or an alloy of tin, silver, and copper.

An underfill resin 53 is formed between the semiconductor element 51 and the wiring substrate 10. The material of the underfill resin 53 may be, for example, an insulative resin such as an epoxy resin.

The wiring substrate 10 includes external connection pads P12A and P12B. The external connection pads P12A and P12B are exposed from the lower surface of the wiring substrate 10. The external connection pads P12A and P12B are connected to external connection terminals 55A and 55B. The external connection terminals 55A and 55B are used to mount the wiring substrate 10 on, for example, a mount board such as a motherboard. The external connection terminals 55A and 55B are, for example, solder bumps. The material of the solder bumps may be, for example, an alloy containing lead (Pb), an alloy of Sn and Cu, an alloy of Sn and silver (Ag), or an alloy of Sn, Ag, and Cu. The external connection terminals 55A and 55B may be solder balls or lead pins.

The semiconductor element 51, which is mounted on the wiring substrate 10, sends signals to the external connection pads P11 and receives signals from the external connection pads P11. The wiring substrate 10 transmits signals between the external connection pads P11 and the external connection pads P12A. The wiring substrate 10 includes a conductor (signal wiring structure) arranged between the external connection pads P11 and the external connection pads P12A to transmit signals. The signal wiring structure of the wiring substrate 10 transmits a signal output from the semiconductor element 51 through the external connection pads P11 to the external connection pads P12A. The signal is provided to the mount board via the external connection terminals 55A, which are connected to the external connection pads P12A. Also, when receiving a signal output from the mount board via the external connection terminals 55A, the signal wiring structure of the wiring substrate 10 transmits the signal from the external connection pads P12A to the external connection pads P11. The signal is provided to the semiconductor element 51 via the external connection terminals 52, which are connected to the external connection pads P12A.

The wiring substrate 10 incorporates a coil 41. In the first embodiment, the coil 41 is connected to the external connection pads P12B of the wiring substrate 10.

As illustrated in FIG. 1B, the wiring substrate 10 includes a wiring layer 11, an insulation layer 12, a magnetic layer 13, a wiring layer 14, an insulation layer 15, a wiring layer 16, an insulation layer 17, and a wiring layer 18 that are stacked. The wiring layer 14 includes a coil wiring 14P of the coil 41.

The wiring layer 11 includes wiring portions 11A and 11B. The wiring portions 11A and 11B respectively have lower surfaces 11Ab and 11Bb exposed from the lower surface of the insulation layer 12. The insulation layer 12 covers part of upper surfaces 11Aa and 11Ba of the wiring portions 11A and 11B and side surfaces 11Ac and 11Bc of the wiring portions 11A and 11B.

In the first embodiment, the wiring layer 11 (wiring portions 11A and 11B) includes a first metal layer and a second metal layer formed one on the other. The second metal layer covers the upper surface of the first metal layer. The material of the first metal layer may be, for example, a metal such as nickel (Ni), titanium (Ti), chromium (Cr), or tin (Sn) or an alloy containing at least one kind of metal selected from these metals. The material of the second metal layer may be, for example, copper (Cu) or a Cu alloy.

The insulation layer 12 covers part of the upper surface of the wiring layer 11 and the side surface of the wiring layer 11. The insulation layer 12 includes openings 12X, which partially expose the upper surfaces 11Aa of the wiring portions 11A of the wiring layer 11, and openings 12Y, which partially expose the upper surfaces 11Ba of the wiring portions 11B of the wiring layer 11. In the first embodiment, the insulation layer 12 has a lower surface 12b located at a lower position than the lower surfaces 11Ab and 11Bb of the wiring portions 11A and 11B of the wiring layer 11. Thus, the insulation layer 12 includes openings 12bX and 12bY exposing the lower surfaces 11Ab and 11Bb of the wiring portions 11A and 11B. The openings 12bX and 12bY facilitate formation of the external connection terminals 55A and 55B illustrated in FIG. 1A. The material of the insulation layer 12 may be, for example, an insulative resin, the main component of which is a photosensitive resin such as a phenol resin or a polyimide resin, or a thermosetting insulative resin, the main component of which is an epoxy resin. The insulative resin may contain, for example, a filler such as silica or alumina.

The insulation layer 12 has an upper surface 12a covered by the magnetic layer 13. The magnetic layer 13 includes openings 13X and 13Y, which partially expose the upper surfaces 11Aa and 11Ba of the wiring portions 11A and 11B of the wiring layer 11. In the first embodiment, the openings 13X of the magnetic layer 13 are continuous with the openings 12X of the insulation layer 12. For example, the openings 13X and 12X are formed so that the wall surfaces of the openings 13X of the magnetic layer 13 are continuous with the wall surfaces of the respective openings 12X of the insulation layer 12. In the same manner, the openings 13Y of the magnetic layer 13 are continuous with the openings 12Y of the insulation layer 12. For example, the openings 13Y and 12Y are formed so that the wall surfaces of the openings 13Y of the magnetic layer 13 are continuous with the wall surfaces of the respective openings 12Y of the insulation layer 12.

The magnetic layer 13 may be formed from a magnetic material in which a magnetic filler is mixed with an insulative resin. The insulative resin may be, for example, an epoxy resin or a polyimide resin. The magnetic filler may be, for example, manganese (Mn)-Zinc (Zn) ferrite, Ni—Zn ferrite, an iron (Fe)-cobalt (Co) alloy, or an Fe-silicon (Si) alloy. The magnetic layer 13 containing an insulative resin as describe above has a resistance value that is, for example, the same level as that of the insulation layer 12. The resistance value of the magnetic layer 13 is higher than that of a wiring layer of, for example, Cu or a Cu alloy. Thus, signals will not transmit between the two wirings that are in contact with the magnetic layer 13. Additionally, the magnetic layer 13 contains the magnetic filler. This improves the L value of the coil 41.

The wiring layer 14 is formed on an upper surface 13a of the magnetic layer 13. The wiring layer 14 includes the coil wiring 14P, which is formed on the upper surface 13a of the magnetic layer 13, and via wirings 14V formed in the openings 13Y of the magnetic layer 13 and the openings 12Y of the insulation layer 12. The coil wiring 14P of the first embodiment is a planar coil spirally formed on the upper surface 13a of the magnetic layer 13. The via wirings 14V electrically connect the coil wiring 14P to the wiring portions 11B of the wiring layer 11 at two opposite ends of the coil wiring 14P. The material of the wiring layer 14 may be Cu or a Cu alloy.

The insulation layer 15 is formed on the upper surface 13a of the magnetic layer 13. The insulation layer 15 covers the upper surface 13a of the magnetic layer 13, the wall surfaces of the openings 13X of the magnetic layer 13, the wall surfaces of the openings 12X of the insulation layer 12, and the wiring layer 14. The insulation layer 15 includes a first insulation layer 15A, which covers the upper surface 13a of the magnetic layer 13 and the wiring layer 14, and a second insulation layer 15B, which covers the wall surfaces of the openings 13X of the magnetic layer 13 and the wall surfaces of the openings 12X of the insulation layer 12.

The insulation layer 15 includes openings 15X, which partially expose the upper surfaces 11Aa of the wiring portions 11A of the wiring layer 11. The openings 15X are located inward from the openings 13X of the magnetic layer 13 and the openings 12X of the insulation layer 12 and extend through the first insulation layer 15A and the second insulation layer 15B. The material of the insulation layer 15 may be, for example, an insulative resin, the main component of which is a photosensitive resin such as a phenol resin or a polyimide resin, or a thermosetting insulative resin, the main component of which is an epoxy resin. The insulative resin may contain, for example, a filler such as silica or alumina.

The wiring layer 16 is formed on an upper surface 15a of the insulation layer 15. The wiring layer 16 includes wiring portions 16P, which are formed on the upper surface 15a of the insulation layer 15, and via wirings 16V, which are formed in the openings 15X of the insulation layer 15. The via wirings 16V electrically connect the wiring portions 16P of the wiring layer 16 to the wiring portions 11A of the wiring layer 11. The material of the wiring layer 16 may be Cu or a Cu alloy.

The insulation layer 17 covers the upper surface 15a of the insulation layer 15 and the wiring layer 16. The insulation layer 17 includes openings 17X, which partially expose an upper surface 16a of the wiring layer 16. The material of the insulation layer 17 may be, for example, an insulative resin, the main component of which is a photosensitive resin such as a phenol resin or a polyimide resin, or a thermosetting insulative resin, the main component of which is an epoxy resin. The insulative resin may contain, for example, a filler such as silica or alumina.

The wiring layer 18 is formed on an upper surface 17a of the insulation layer 17. The wiring layer 18 includes wiring portions 18P, which are formed on the upper surface 17a of the insulation layer 17, and via wirings 18V, which are formed in the openings 17X of the insulation layer 17. The via wirings 18V electrically connect the wiring portions 18P of the wiring layer 18 to the wiring portions 16P of the wiring layer 16. The material of the wiring layer 18 may be Cu or a Cu alloy.

A solder resist layer 19 is formed on the upper surface 17a of the insulation layer 17. The solder resist layer 19 covers the upper surface 17a of the insulation layer 17 and part of the wiring layer 18. The solder resist layer 19 includes openings 19X, which partially expose an upper surface 18a of the wiring layer 18 as the external connection pads P11. The material of the solder resist layer 19 may be, for example, an insulative resin such as an epoxy resin or an acrylic resin.

As necessary, an OSP process may be performed on the upper surface of the wiring layer 18 exposed from the openings 19X of the solder resist layer 19 to form an OSP film. Also, a metal layer may be formed on the upper surface of the wiring layer 18 exposed from the openings 19X. The metal layer is, for example, an Au layer, a Ni layer/Au layer (metal layer in which Au layer is formed on Ni layer that serves as bottom layer), or a Ni layer/Pd layer/Au layer (metal layer in which Ni layer serves as bottom layer, and Ni layer, Pd layer, and Au layer are sequentially stacked). The wiring layer 18 (or OSP film or metal layer formed on wiring layer 18) exposed from the openings 19X may be used as the external connection pads P11.

Manufacturing Steps

The steps of manufacturing the wiring substrate 10 will now be described.

As illustrated in FIG. 2A, a support substrate 60 is prepared. The support substrate 60 may be, for example, a carrier-added metal foil. The support substrate 60 may be a different known support substrate. The support substrate 60 includes a carrier plate 61 and an ultrathin metal foil 62 formed on one surface (upper surface in FIG. 2A) of the carrier plate 61 with a delamination layer (not illustrated) located in between. The material of the carrier plate 61 may be, for example, Cu or a Cu alloy. The material of the metal foil 62 may be, for example, Cu or a Cu alloy.

Figure 2B:
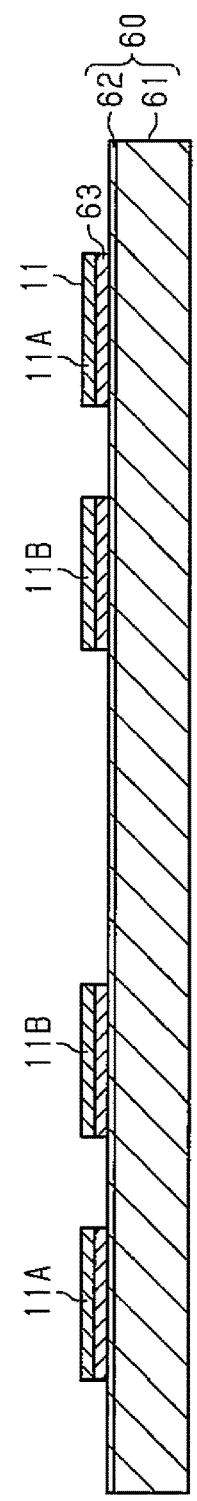

In the step illustrated in FIG. 2B, a metal layer 63 and the wiring layer 11 are sequentially formed on the upper surface of the metal foil 62. For example, a resist layer including openings is formed on the upper surface of the metal foil 62. The openings are formed in positions corresponding to the wiring portions 11A and 11B illustrated in FIGS. 1A and 1B. The resist layer may be formed from a material having, for example, resistance to a process (e.g., plating) that forms the metal layer 63 and the wiring layer 11. The material of the resist layer may be, for example, a photosensitive dry film resist (e.g., novolac resin or acrylic resin).

The metal layer 63 and the wiring layer 11 are sequentially formed on the upper surface of the metal foil 62 through electrolytic plating (electrolytic copper plating) that uses the resist layer as a plating mask and the metal foil 62 as a power feeding layer. When the wiring layer 11 is formed by a first metal layer and a second metal layer as described above, the first metal layer and the second metal layer are sequentially formed on the upper surface of the metal layer 63. Subsequently, the resist layer is removed, for example, through asking or with an alkaline stripping solution.

Figure 2C:
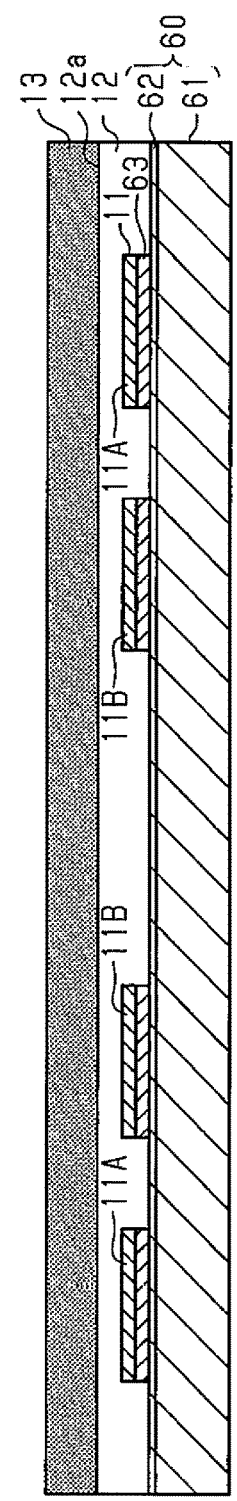

In the step illustrated in FIG. 2C, the insulation layer 12 and the magnetic layer 13 are formed. The insulation layer 12 is formed to cover the upper surface of the metal foil 62, the wiring layer 11, and the metal layer 63. The material of the insulation layer 12 may be, for example, an organic resin such as an epoxy resin or a polyimide resin or a resin material in which such an organic resin is mixed with a filler such as silica or alumina. The insulation layer 12 is obtained, for example, by vacuum-laminating with a resin film and curing the resin film with application of heat. Alternatively, the insulation layer 12 may be formed by applying a resin paste or liquid and heating the resin. The magnetic layer 13 is formed to cover the upper surface 12a of the insulation layer 12. The magnetic layer 13 may be, for example, an uncured film formed from a magnetic material in which a magnetic filler is mixed with an insulative resin. The magnetic layer 13 is obtained, for example, by vacuum-laminating a film of a magnetic material and curing the film with application of heat.

In the step illustrated in FIG. 3A, the openings 13Y are formed in the magnetic layer 13, and the openings 12Y are formed in the insulation layer 12. The openings 13Y and 12Y may be formed, for example, with a laser drilling machine such as a $CO_2$ laser or a UV-YAG layer. Laser beams are emitted toward the upper surface 13a of the magnetic layer 13 to form the openings 13Y extending through the magnetic layer 13 and the openings 12Y extending through the insulation layer 12. The openings 13Y and 12Y partially expose the upper surfaces of the wiring portions 11B of the wiring layer 11. As necessary, a desmear process may be performed.

In the step illustrated in FIG. 3B, the wiring layer 14 is formed. The wiring layer 14 includes the via wirings 14V formed in the openings 13Y and 12Y and the coil wiring 14P formed on the upper surface 13a of the magnetic layer 13. A seed layer (not illustrated) is formed on the upper surface 13a of the magnetic layer 13, the wall surfaces of the openings 13Y of the magnetic layer 13, the wall surfaces of the openings 12Y of the insulation layer 12, and the upper surfaces of the wiring portions 11B of the wiring layer 11 exposed in the openings 13Y and 12Y. The material of the seed layer may be, for example, copper or a copper alloy. The seed layer may be formed through, for example, electroless plating or sputtering.

The seed layer is covered by a resist layer (not illustrated) including openings in given locations. The openings are formed in positions corresponding to the coil wiring 14P of the wiring layer 14. The resist layer may be formed from a material having, for example, resistance to plating performed in the next step. Electrolytic plating (electrolytic copper plating) that uses the seed layer as a power feeding electrode is performed to deposit and develop a plating metal on the seed layer exposed in the openings of the resist layer. The resist layer is removed, for example, through asking or with an alkaline stripping solution. Subsequently, the exposed seed layer is removed through etching. This obtains the wiring layer 14 including the via wirings 14V and the coil wiring 14P.

In the step illustrated in FIG. 3C, the openings 13X are formed in the magnetic layer 13, and the openings 12X are formed in the insulation layer 12. The openings 13X and 12X may be formed, for example, with a laser drilling machine such as a $CO_2$ laser or a UV-YAG layer. Laser beams are emitted toward the upper surface 13a of the magnetic layer 13 to form the openings 13X extending through the magnetic layer 13 and the openings 12X extending through the insulation layer 12. The openings 13X and 12X partially expose the upper surfaces of the wiring portions 11A of the wiring layer 11. As necessary, a desmear process may be performed.

In the step illustrated in FIG. 4A, the insulation layer 15 is formed to cover the upper surface of the magnetic layer 13 and the wiring layer 14. The material of the insulation layer 15 may be, for example, an organic resin such as an epoxy resin or a polyimide resin or a resin material in which such an organic resin is mixed with a filler such as silica or alumina. The insulation layer 15 is obtained, for example, by vacuum-laminating a resin film and curing the resin film with application of heat. Alternatively, the insulation layer 15 may be formed by applying a resin paste or liquid and heating the resin.

In the step illustrated in FIG. 4B, the openings 15X are formed in the insulation layer 15. The openings 15X may be formed, for example, with a laser drilling machine such as a $CO_2$ laser or a UV-YAG layer. Laser beams are positioned in accordance with the openings 13X of the magnetic layer 13 and emitted toward the upper surface 15a of the insulation layer 15. This forms the openings 15X extending through the insulation layer 15 inward from the openings 13X of the magnetic layer 13 and the openings 12X of the insulation layer 12. The openings 15X partially expose the upper surfaces of the wiring portions 11A of the wiring layer 11. As necessary, a desmear process may be performed.

In the step illustrated in FIG. 4C, the wiring layer 16 is formed. A seed layer (not illustrated) is formed on the upper surface of the insulation layer 15, the wall surfaces of the openings 15X of the insulation layer 15, and the upper surface of the wiring layer 11 (wiring portions 11A) exposed in the openings 15X of the insulation layer 15. The material of the seed layer may be, for example, copper or a copper alloy. The seed layer may be formed through, for example, electroless plating or sputtering. The seed layer is covered by a resist layer (not illustrated) including openings in given locations. The openings are formed in positions corresponding to the wiring portions 16P of the wiring layer 16. The resist layer may have, for example, resistance to plating performed in the next step. Electrolytic plating (electrolytic copper plating) that uses the seed layer as a power feeding electrode is performed to deposit and develop a plating metal on the seed layer exposed in the openings of the resist layer. The resist layer is removed, for example, through asking or with an alkaline stripping solution. Subsequently, the exposed seed layer is removed through etching to obtain the wiring layer 16.

In the step illustrated in FIG. 5A, the insulation layer 17 including the openings 17X is formed. The upper surface 15a of the insulation layer 15 and the wiring layer 16 are, for example, vacuum-laminated with an epoxy resin film. The resin film is cured by application of heat. This forms the insulation layer 17. Alternatively, the insulation layer 17 may be formed by applying a resin paste or liquid and heating the resin. The openings 17X are formed in the insulation layer 17. The openings 17X may be formed, for example, with a laser drilling machine such as a $CO_2$ laser or a UV-YAG layer. Laser beams are emitted toward the upper surface 17a of the insulation layer 17 to form the openings 17X extending through the insulation layer 17. The openings 17X partially expose the upper surface of the wiring layer 16. As necessary, a desmear process may be performed.

In the step illustrated in FIG. 5B, the wiring layer 18 is formed. A seed layer (not illustrated) is formed on the upper surface of the insulation layer 17, the wall surfaces of the openings 17X of the insulation layer 17, and the upper surface of the wiring layer 16 exposed in the openings 17X of the insulation layer 17. The material of the seed layer may be, for example, copper or a copper alloy. The seed layer may be formed through, for example, electroless plating or sputtering. The seed layer is covered by a resist layer (not illustrated) including openings in given locations. The openings are formed in positions corresponding to the wiring portions 18P of the wiring layer 18. The resist layer may be formed from a material having, for example, resistance to plating performed in the next step. Electrolytic plating (electrolytic copper plating) that uses the seed layer as a power feeding electrode is performed to deposit and develop a plating metal on the seed layer exposed in the openings of the resist layer. The resist layer is removed, for example, through asking or with an alkaline stripping solution. Subsequently, the exposed seed layer is removed through etching to obtain the wiring layer 18.

Figure 6A:
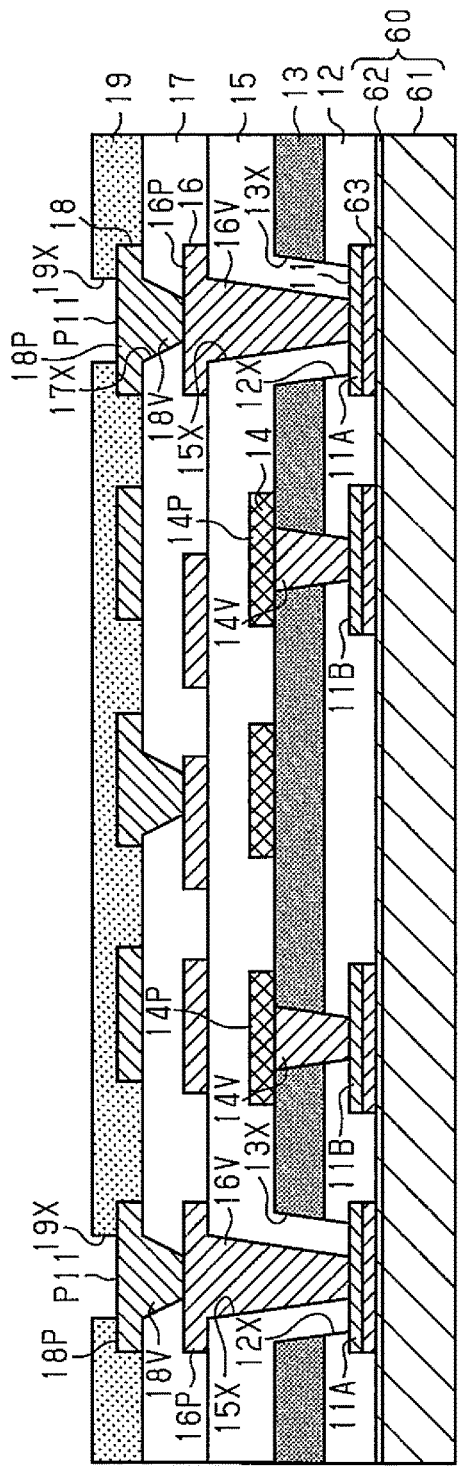

In the step illustrated in FIG. 6A, the solder resist layer 19 including the openings 19X is formed. The solder resist layer 19 is obtained, for example, by laminating with a photosensitive solder resist film or applying a liquid solder resist and exposing and developing the resist through photolithography to be patterned in a desired shape.

Figure 6B:
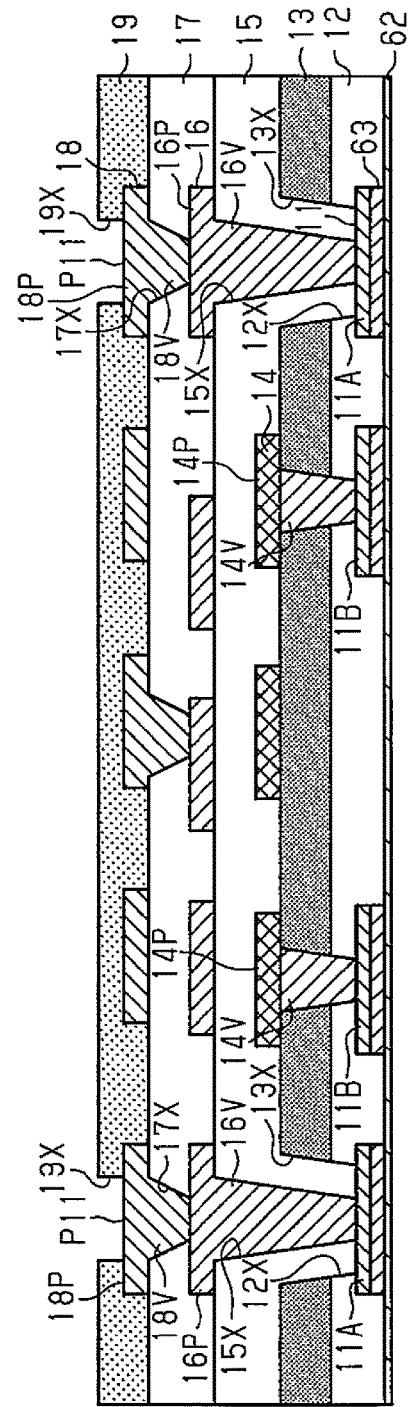

In the step illustrated in FIG. 6B, the carrier plate 61 illustrated in FIG. 6A is removed. The carrier plate 61 is delaminated from the metal foil 62 of the support substrate 60. The delamination layer located between the carrier plate 61 and the metal foil 62 helps delaminate the carrier plate 61. Then, the metal foil 62 and the metal layer 63 are removed. The metal foil 62 and the metal layer 63 are removed, for example, through wet etching that uses a hydrogen peroxide/sulfuric acid solution, a sodium persulfate solution, or an ammonium persulfate solution. At this time, the etching time is controlled so that the wiring portions 11A and 11B remain. When the wiring layer 11 includes a first metal layer (e.g., Ni) and a second metal layer (e.g., Cu) as described above, the first metal layer functions as an etching stop layer so that the wiring portions 11A and 11B remain. This obtains the wiring substrate 10 illustrated in FIG. 1B.

Operation

The wiring substrate 10 of the first embodiment includes the coil wiring 14P on the upper surface 13a of the magnetic layer 13. Thus, the magnetic layer 13 is in contact with the lower surface of the coil wiring 14P. The coil wiring 14P is spiral in a plan view.

The coil 41 of the wiring substrate 10 of the first embodiment, which includes the magnetic layer 13 adhering to the coil wiring 14P, will now be compared with a coil of a wiring substrate that does not include the magnetic layer 13. For the sake of brevity, in the description hereafter, a coil having the coil wiring 14P adhering to the magnetic layer 13 is referred to as "the magnetic coil," and a coil of a wiring substrate that does not include the magnetic layer 13 is referred to as "the non-magnetic coil." The inductance (L value) of "the magnetic coil" is greater than the L value of "the non-magnetic coil." When the L value of "the magnetic coil" is set to be equal to the L value of "the non-magnetic coil," the wiring length of "the magnetic coil" is shorter than the wiring length of "the non-magnetic coil." Thus, use of "the magnetic coil" decreases the area occupied by "the magnetic coil" and reduces the number of wiring layers. As a result, the magnetic layer 13 adhering to the coil wiring 14P, that is, the wiring substrate 10 of the first embodiment including "the magnetic coil," may be reduced in area and thinned.

As illustrated in FIG. 1A, in the semiconductor device 1 of the first embodiment, signals input to and output from the semiconductor element 51 are transmitted between the external connection terminals 55A and 52 via the wiring portions 11A of the wiring layer 11, the wiring layer 16, and the wiring layer 18 of the wiring substrate 10. The external connection terminals 55A are connected to the external connection pads P12A of the wiring portions 11A of the wiring layer 11. The external connection terminals 52 are connected to the external connection pads P11 of the wiring portions 18P of the wiring layer 18. Thus, the wiring portions 11A of the wiring layer 11, the via wirings 16V and the wiring portions 16P of the wiring layer 16, and the via wirings 18V and the wiring portions 18P of the wiring layer 18 serve as a line (signal wiring structure) that transmit signals through the wiring substrate 10. In the wiring layer 16, the via wirings 16V, which connect the wiring portions 16P of the wiring layer 16 and the wiring portions 11A of the wiring layer 11, are located inward from the openings 13X extending through the magnetic layer 13. Thus, the line transmitting signals to and from the semiconductor element 51 extends through the magnetic layer 13, but is not in contact with the magnetic layer 13.

The magnetic layer 13 has a lower surface 13b covered by the insulation layer 12. The upper surface 13a of the magnetic layer 13 is covered by the insulation layer 15. The wall surfaces of the openings 13X of the magnetic layer 13 are covered by the second insulation layer 15B of the insulation layer 15. Thus, the magnetic layer 13 is not in contact with the via wirings 16V, which are formed in the openings 15X extending through the second insulation layer 15B. In other words, in the first embodiment, the magnetic layer 13 of the wiring substrate 10 is not in direct contact with the signal wiring structure of the wiring substrate 10. With such a structure, the signal transmission performance is improved in the wiring substrate 10 including the magnetic layer 13, and the insertion loss is reduced.

FIGS. 7A to 7D are cross-sectional views of various wiring substrate models 70a to 70d for measurement of S-parameters (S21) corresponding to transmission of signals.

Figure 7A:
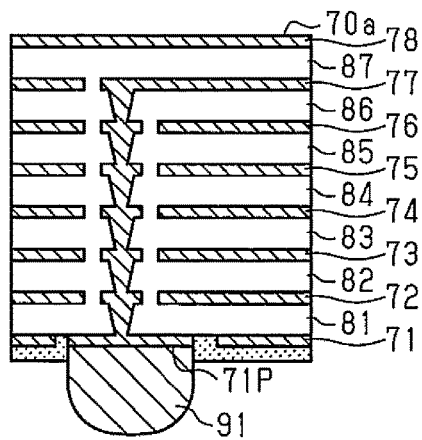
FIGS. 7A to 7D are schematically cross-sectional views illustrating various models of wiring substrates for measurement of S-parameters (S21)

FIG. 7A illustrates a first model 70a. The first model 70a is a wiring substrate including a wiring layer 71, an insulation layer 81, a wiring layer 72, an insulation layer 82, a wiring layer 73, an insulation layer 83, a wiring layer 74, an insulation layer 84, a wiring layer 75, an insulation layer 85, a wiring layer 76, an insulation layer 86, a wiring layer 77, an insulation layer 87, and a wiring layer 78 that are sequentially stacked. An external connection terminal 91 is connected to the lower surface of an external connection pad 71P of the wiring layer 71. The wiring layers 72 to 77 include via wirings extending through the insulation layers 81 to 86 to connect the wiring layers 72 to 77 to the wiring layers 71 to 76, respectively. The first model 70a does not include a magnetic layer.

Figure 7B:
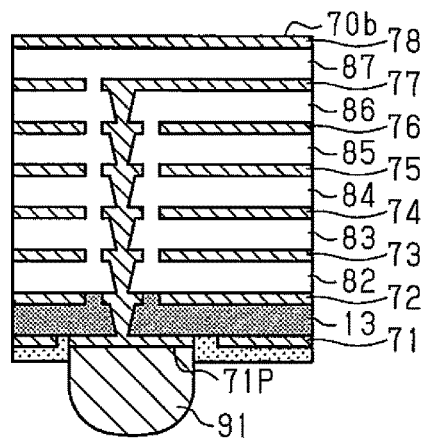

FIG. 7B illustrates a second model 70b. In the second model 70b, the insulation layer 81 of the first model 70a is replaced with the magnetic layer 13. In the second model 70b, the magnetic layer 13 is in contact with the wiring layer 71 and the wiring layer 72.

Figure 7C:
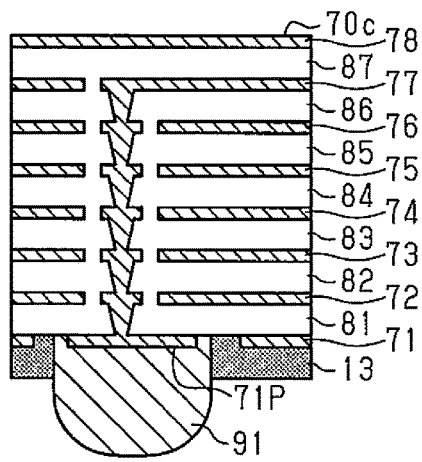

FIG. 7C illustrates a third model 70c. The third model 70c differs from the first model 70a in that the external connection terminal 91 covers the lower and side surfaces of the external connection pad 71P of the wiring layer 71. Additionally, in the third model 70c, the magnetic layer 13 covers the lower surface of the insulation layer 81, the lower surface and the side surfaces of the wiring layer 71 except for the external connection pad 71P, and part of the external connection terminal 91. The magnetic layer 13 of the third model 70c is not in direct contact with the wiring that serves as the signal transmission line.

Figure 7D:
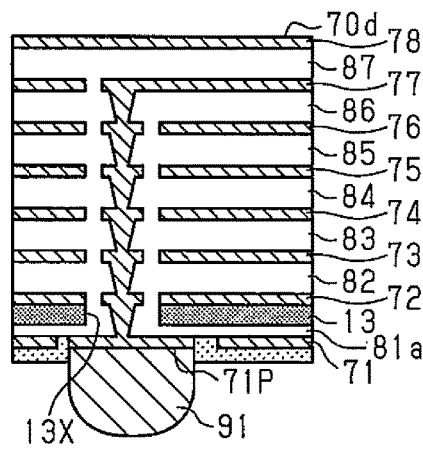

FIG. 7D illustrates a fourth model 70d. The fourth model 70d differs from the second model 70b in that the magnetic layer 13 includes the opening 13X while covering the lower surface of the wiring layer 72. However, the magnetic layer 13 includes the openings 13X. Additionally, the fourth model 70d includes an insulation layer 81a covering the lower surface of the magnetic layer 13 and filling the openings 13X of the magnetic layer 13. Thus, in the fourth model 70d, the wiring serving as the signal transmission line extends through the magnetic layer 13, and the insulation layer 81a is located between the wiring of the signal transmission line and the magnetic layer 13. That is, the wiring of the signal transmission line is not in contact with the magnetic layer 13.

In each of the models 70a to 70d, a signal is provided to the wiring layer 77. The signal is transmitted to the external connection terminal 91 via the wiring layers 77 to 71. The signal is observed at the external connection terminal 91. The S-parameter (insertion loss; S21) of each of the models 70a to 70d is calculated based on the level of the signal provided to the wiring layer 77 and the level of the signal observed at the external connection terminal 91.

Figure 8:
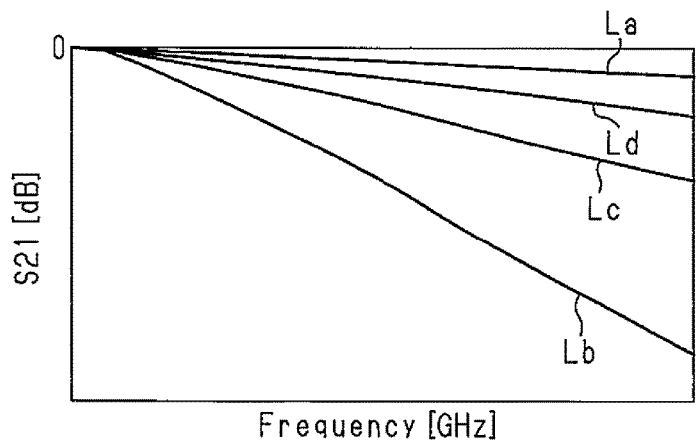
FIG. 8 is a property chart illustrating S-parameters (S21) of the models illustrated in FIGS. 7A to 7D.

FIG. 8 illustrates the results of simulations of the S-parameters (insertion loss: S21) of the models 70a to 70d illustrated in FIGS. 7A to 7D. In FIG. 8, the horizontal axis indicates frequencies (GHz) of the signals, and the vertical axis indicates S21 (insertion loss; dB). In the horizontal axis of FIG. 8, the frequency increases toward the right. In the vertical axis of FIG. 8, S21 (insertion loss) increases toward the lower side. In FIG. 8, curve lines La to Ld illustrate S21 (insertion loss) of the first to fourth models 70a to 70d illustrated in FIGS. 7A to 7D.

In the second model 70b illustrated in FIG. 7B, the magnetic layer 13 is in direct contact with the wiring layers 71 and 72. In this case, as indicated by the curve line Lb in FIG. 8, the insertion loss of the second model 70b corresponding to high frequency signals largely increases as compared to the insertion loss (curve line La in FIG. 8) of the first model 70a, which does not include the magnetic layer 13.

In the third model 70c illustrated in FIG. 7C, the magnetic layer 13 is not in direct contact with the wiring of the wiring layers 71 and 72 transmitting signals. In this case, as indicated by the curve line Lc in FIG. 8, the insertion loss of the third model 70c corresponding to high frequency signals is smaller than the insertion loss (curve line Lb in FIG. 8) of the second model 70b. Thus, when the magnetic layer 13 is not in direct contact with the wiring of the signal transmission line, the insertion loss is reduced, and the transmission performance of a high frequency signal is improved.

In the fourth model 70d illustrated in FIG. 7D, the magnetic layer 13 is not in contact with the wiring of the wiring layers 71 and 72 transmitting signals. In this case, as indicated by the curve line Ld in FIG. 8, the insertion loss of the fourth model 70d corresponding to high frequency signals is smaller than the insertion losses (curve lines Lb and Lc in FIG. 8) of the second and third models 70b and 70c. Thus, when the magnetic layer 13 is not in contact with the wiring of the signal transmission line, the insertion loss is further reduced, and the transmission performance of a high frequency signal is further improved.

The first embodiment has the advantages described below.

(1-1) The semiconductor device 1 includes the wiring substrate 10 and the semiconductor element 51 mounted on the wiring substrate 10. The wiring substrate 10 includes the wiring layer 11, the insulation layer 12, the magnetic layer 13, the wiring layer 14, the insulation layer 15, the wiring layer 16, the insulation layer 17, and the wiring layer 18 that are stacked. The wiring layer 14 is formed on the upper surface 13a of the magnetic layer 13. The wiring layer 14 includes the coil wiring 14P located on the upper surface 13a of the magnetic layer 13. The coil wiring 14P is a planar coil, for example, spirally formed on the upper surface 13a of the magnetic layer 13. The wiring portions 11A of the wiring layer 11, the via wirings 16V and the wiring portions 16P of the wiring layer 16, and the via wirings 18V and the wiring portions 18P of the wiring layer 18 form the line (signal wiring structure) that transmits signals in the wiring substrate 10. The magnetic layer 13 is not in contact with the via wirings 16V, which are formed in the openings 15X extending through the second insulation layer 15B. In other words, in the first embodiment, the magnetic layer 13 of the wiring substrate 10 is not in direct contact with the signal wiring structure of the wiring substrate 10. With such a structure, the signal transmission performance is improved in the wiring substrate 10 including the magnetic layer 13, and the insertion loss is reduced.

(1-2) The magnetic layer 13 may be formed from a magnetic material in which a magnetic filler is mixed with an insulative resin. The magnetic layer 13 containing the insulative resin has a resistance value that is, for example, at the same level as that of the insulation layer 12. The resistance value of the magnetic layer 13 is higher than that of a wiring layer of, for example, Cu or a Cu alloy. This allows the magnetic layer 13 to adhere to the coil wiring 14P. Additionally, the magnetic layer 13 contains the magnetic filler. This improves the L value of the coil 41.

Second Embodiment

A second embodiment will now be described. In the second embodiment, the same reference characters are given to those components that are the same as the corresponding components of the first embodiment. Such components may not be described in detail.

As illustrated in FIG. 9A, a semiconductor device 101 includes a wiring substrate 110 and the semiconductor element 51 mounted on the wiring substrate 110.

The semiconductor element 51 is connected to external connection pads P21 of the wiring substrate 110 by the external connection terminals 52. The semiconductor element 51 is flip-chip-connected to the external connection pads P21 of the wiring substrate 110. The semiconductor element 51 is, for example, a logic chip such as a central processing unit (CPU) or a graphics processing unit (GPU) or a memory chip such as a dynamic random access memory (DRAM) or a static random access memory (SRAM). The external connection terminals 52 are, for example, solder bumps or gold bumps. The material of the solder bumps may be, for example, an alloy containing lead, an alloy of tin and gold, an alloy of tin and copper, an alloy of tin and silver, or an alloy of tin, silver, and copper.

The underfill resin 53 is formed between the semiconductor element 51 and the wiring substrate 110. The material of the underfill resin 53 may be, for example, an insulative resin such as an epoxy resin.

The wiring substrate 110 includes external connection pads P22A and P22B. The external connection pads P22A and P22B are exposed from the lower surface of the wiring substrate 110. The external connection terminals 55A and 55B are connected to the external connection pads P22A and P22B. The external connection terminals 55A and 55B are used to mount the wiring substrate 110 on, for example, a mount board such as a motherboard. The external connection terminals 55A and 55B are, for example, solder bumps. The material of the solder bumps may be, for example, an alloy containing lead (Pb), an alloy of Sn and Cu, an alloy of Sn and silver (Ag), or an alloy of Sn, Ag, and Cu. The external connection terminals 55A and 55B may be solder balls or lead pins.

The semiconductor element 51, which is mounted on the wiring substrate 110, sends signals to the external connection pads P21 and receives signals from the external connection pads P21. The wiring substrate 110 transmits signals between the external connection pads P21 and the external connection pads P22A. The wiring substrate 110 includes a conductor (signal wiring structure) arranged between the external connection pads P21 and the external connection pads P22A to transmit signals. The signal wiring structure of the wiring substrate 110 transmits a signal output from the semiconductor element 51 through the external connection pads P21 to the external connection pads P22A. The signal is provided to the mount board via the external connection terminals 55A, which are connected to the external connection pads P22A. Also, when receiving a signal output from the mount board via the external connection terminals 55A, the signal wiring structure of the wiring substrate 110 transmits the signal from the external connection pads P22A to the external connection pads P21. The signal is provided to the semiconductor element 51 via the external connection terminals 52, which are connected to the external connection pads P21.

The wiring substrate 110 incorporates a coil 141. In the second embodiment, the coil 141 is connected to the external connection pads P22B of the wiring substrate 110.

As illustrated in FIG. 9B, the wiring substrate 110 includes a wiring layer 111, a magnetic layer 113, a wiring layer 114, an insulation layer 115, a wiring layer 116, an insulation layer 117, and a wiring layer 118 that are stacked. The wiring layer 114 includes a coil wiring 114P of the coil 141.

The wiring layer 111 includes wiring portions 111A and 111B. The wiring portions 111B are in contact with the magnetic layer 113. The wiring portions 111B are embedded in the magnetic layer 113 so that the lower surfaces of the wiring portions 111B are exposed.

The magnetic layer 113 includes openings 113X extending through the magnetic layer 113 in the thickness-wise direction. The openings 113X are filled with the insulation layer 115, which covers an upper surface 113a of the magnetic layer 113. The wiring portions 111A of the wiring layer 111 are embedded in the insulation layer 115 so that the lower surfaces of the wiring portions 111A are exposed. The magnetic layer 113 includes openings 113Y, which partially expose upper surfaces 111Ba of the wiring portions 111B of the wiring layer 111.

The wiring portions 111A has lower surfaces 111Ab, which are located inward from the openings 113X of the magnetic layer 113 and exposed from the insulation layer 115. The insulation layer 115 covers part of upper surfaces 111Aa of the wiring portions 111A and side surfaces 111Ac of the wiring portions 111A. The wiring portions 111B have lower surfaces 111Bb exposed from a lower surface 113b of the magnetic layer 113. The magnetic layer 113 covers side surfaces 111Bc of the wiring portions 111B and part of the upper surfaces 111Ba of the wiring portions 111B.

In the second embodiment, the wiring layer 111 includes a first metal layer and a second metal layer formed one on the other. The second metal layer covers the upper surface of the first metal layer. The material of the first metal layer may be, for example, a metal such as nickel (Ni), titanium (Ti), chromium (Cr), or tin (Sn) or an alloy containing at least one kind of metal selected from these metals. The material of the second metal layer may be, for example, copper (Cu) or a Cu alloy.

The magnetic layer 113 may be formed from a magnetic material in which a magnetic filler is mixed with an insulative resin. The insulative resin may be, for example, an epoxy resin or a polyimide resin. The magnetic filler may be, for example, manganese (Mn)-Zinc (Zn) ferrite, Ni—Zn ferrite, an iron (Fe)-cobalt (Co) alloy, or an Fe-silicon (Si) alloy.

The wiring layer 114 is formed on the upper surface 113a of the magnetic layer 113. The wiring layer 114 includes the coil wiring 114P, which is formed on the upper surface 113a of the magnetic layer 113, and via wirings 114V, which are formed in the openings 113Y of the magnetic layer 113. The coil wiring 114P of the second embodiment is a planar coil spirally formed on the upper surface 113a of the magnetic layer 113. The via wirings 114V electrically connect the coil wiring 114P to the wiring portions 111B of the wiring layer 111 at two opposite ends of the coil wiring 114P. The material of the wiring layer 114 may be Cu or a Cu alloy.

The insulation layer 115 covers the upper surface 113a of the magnetic layer 113, the wall surfaces of the openings 113X of the magnetic layer 113, the wiring portions 111A of the wiring layer 111, and the coil wiring 114P of the wiring layer 114. The insulation layer 115 includes a first insulation layer 115A and a second insulation layer 115B. The first insulation layer 115A covers the upper surface 113a of the magnetic layer 113 and the coil wiring 114P of the wiring layer 114. The second insulation layer 115B covers the wall surfaces of the openings 113X of the magnetic layer 113 and the upper and side surfaces of the wiring portions 111A of the wiring layer 111.

The insulation layer 115 includes openings 115X, which partially expose the upper surfaces 111Aa of the wiring portions 111A of the wiring layer 111. The openings 115X are located inward from the openings 113X of the magnetic layer 113 and extend through the first insulation layer 115A and the second insulation layer 115B. The material of the insulation layer 115 may be, for example, an insulative resin, the main component of which is a photosensitive resin such as a phenol resin or a polyimide resin, or a thermosetting insulative resin, the main component of which is an epoxy resin. The insulative resin may contain, for example, a filler such as silica or alumina.

The wiring layer 116 is formed on an upper surface 115a of the insulation layer 115. The wiring layer 116 includes wiring portions 116P, which are formed on the upper surface 115a of the insulation layer 115 and via wirings 116V, which are formed in the openings 115X of the insulation layer 115. The via wirings 116V electrically connect the wiring portions 116P of the wiring layer 116 to the wiring portions 111A of the wiring layer 111. The material of the wiring layer 116 may be Cu or a Cu alloy.

The insulation layer 117 covers the upper surface 115a of the insulation layer 115 and the wiring layer 116. The insulation layer 117 includes openings 117X, which partially expose an upper surface 116a of the wiring portions 116P. The material of the insulation layer 117 may be, for example, an insulative resin, the main component of which is a photosensitive resin such as a phenol resin or a polyimide resin, or a thermosetting insulative resin, the main component of which is an epoxy resin. The insulative resin may contain, for example, a filler such as silica or alumina.

The wiring layer 118 is formed on an upper surface 117a of the insulation layer 117. The wiring layer 118 includes wiring portions 118P, which are formed on the upper surface 117a of the insulation layer 117, and via wirings 118V, which are formed in the openings 117X of the insulation layer 117. The via wirings 118V electrically connect the wiring portions 118P of the wiring layer 118 to the wiring portions 116P of the wiring layer 116. The material of the wiring layer 118 may be Cu or a Cu alloy.

A solder resist layer 119 is formed on the upper surface 117a of the insulation layer 117. The solder resist layer 119 covers the upper surface 117a of the insulation layer 117 and part of the wiring layer 118. The solder resist layer 119 includes openings 119X, which partially expose an upper surface 118a of the wiring layer 118 as the external connection pads P21. The material of the solder resist layer 119 may be, for example, an insulative resin such as an epoxy resin or an acrylic resin.

As necessary, an OSP process may be performed on the upper surface of the wiring layer 118 exposed from the openings 119X of the solder resist layer 119 to form an OSP film. Also, a metal layer may be formed on the upper surface of the wiring layer 118 exposed from the openings 119X. The metal layer is, for example, an Au layer, a Ni layer/Au layer (metal layer in which Au layer is formed on Ni layer that serves as bottom layer), or a Ni layer/Pd layer/Au layer (metal layer in which Ni layer serves as bottom layer, and Ni layer, Pd layer, and Au layer are sequentially stacked). The wiring layer 118 (or OSP film or metal layer formed on wiring layer 118) exposed from the openings 119X may be used as the external connection pads P21.

Manufacturing Steps

The steps of manufacturing the wiring substrate 110 of the second embodiment will now be described.

Figure 10A:
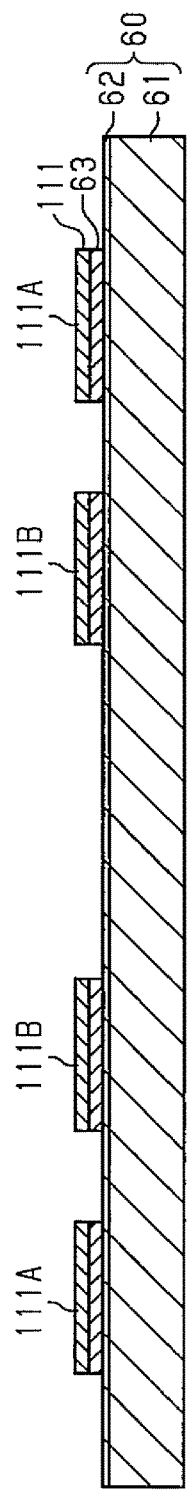

As illustrated in FIG. 10A, a support substrate 60 is prepared. The support substrate 60 may be, for example, a carrier-added metal foil. The support substrate 60 may be a different known support substrate. The support substrate 60 includes a carrier plate 61 and an ultrathin metal foil 62 formed on one surface (upper surface in FIG. 10A) of the carrier plate 61 with a delamination layer (not illustrated) located in between. The material of the carrier plate 61 may be, for example, Cu or a Cu alloy. The material of the metal foil 62 may be, for example, Cu or a Cu alloy.

The metal layer 63 and the wiring layer 111 are sequentially formed on the upper surface of the metal foil 62. For example, a resist layer including openings is formed on the upper surface of the metal foil 62. The openings are formed in positions corresponding to the wiring portions 111A and 111B. The resist layer may be formed from a material having, for example, resistance to a process (e.g., plating) that forms the metal layer 63 and the wiring layer 111. The material of the resist layer may be, for example, a photosensitive dry film resist (e.g., novolac resin or acrylic resin).

The metal layer 63 and the wiring layer 111 are sequentially formed on the upper surface of the metal foil 62 through electrolytic plating (electrolytic copper plating) that uses the resist layer as a plating mask and the metal foil 62 as a power feeding layer. When the wiring layer 111 is formed by a first metal layer and a second metal layer as described above, the first metal layer and the second metal layer are sequentially formed on the upper surface of the metal layer 63. Subsequently, the resist layer is removed, for example, through asking or with an alkaline stripping solution.

Figure 10B:
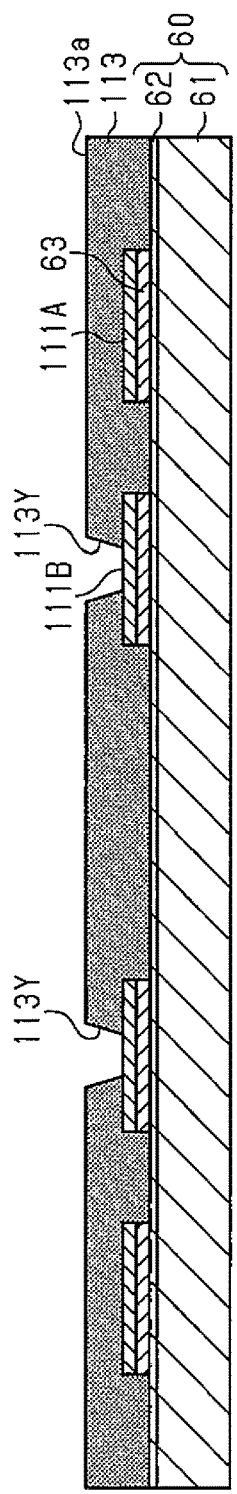

In the step illustrated in FIG. 10B, the magnetic layer 113 including the openings 113Y is formed. The magnetic layer 113 is formed to cover the upper surface of the metal foil 62, the wiring layer 111, and the metal layer 63. The magnetic layer 113 may be, for example, an uncured film formed from a magnetic material in which a magnetic filler is mixed with an insulative resin. The magnetic layer 113 is obtained, for example, by vacuum-laminating a film of a magnetic material and curing the film with application of heat.

The openings 113Y are formed in the magnetic layer 113. The openings 113Y may be formed, for example, with a laser drilling machine such as a $CO_2$ laser or a UV-YAG layer. Laser beams are emitted toward the upper surface 113a of the magnetic layer 113 to form the openings 113Y extending through the magnetic layer 113. The openings 113Y partially expose the upper surfaces of the wiring portions 111B. As necessary, a desmear process may be performed.

Figure 10C:
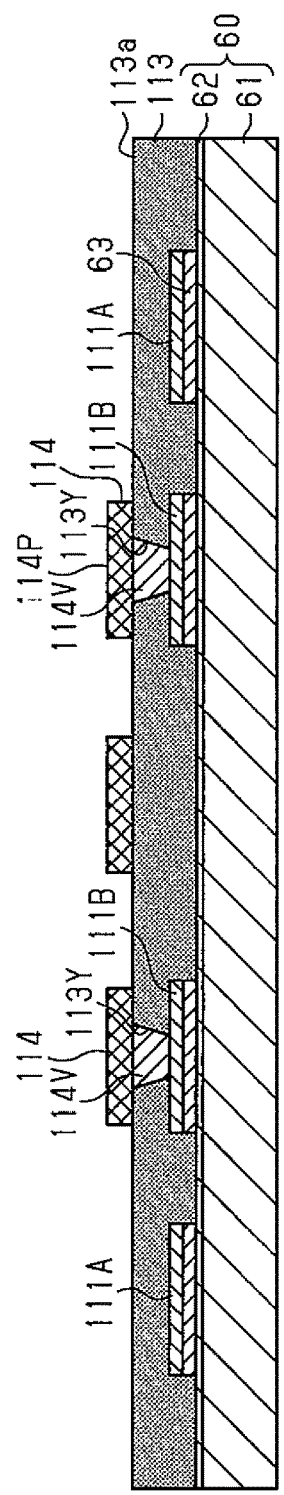

In the step illustrated in FIG. 10C, the wiring layer 114 is formed. The wiring layer 114 includes the via wirings 114V, which are formed in the openings 113Y, and the coil wiring 114P, which is formed on the upper surface 113a of the magnetic layer 113. A seed layer (not illustrated) is formed on the upper surface 113a of the magnetic layer 113, the wall surfaces of the openings 113X of the magnetic layer 113, and the upper surfaces of the wiring portions 111B exposed in the openings 113X. The material of the seed layer may be, for example, copper or a copper alloy. The seed layer may be formed through, for example, electroless plating or sputtering.

The seed layer is covered by a resist layer (not illustrated) including openings in given locations. The openings are formed in positions corresponding to the coil wiring 114P of the wiring layer 114. The resist layer may be formed from a material having, for example, resistance to plating performed in the next step.

Electrolytic plating (electrolytic copper plating) that uses the seed layer as a power feeding electrode is performed to deposit and develop a plating metal on the seed layer exposed in the openings of the resist layer. The resist layer is removed, for example, through asking or with an alkaline stripping solution. Subsequently, the exposed seed layer is removed through etching. This obtains the wiring layer 114 including the via wirings 114V and the coil wiring 114P.

In the step illustrated in FIG. 11A, the openings 113X are formed in the magnetic layer 113 to expose the wiring portions 111A. The openings 113X may be formed, for example, with a laser drilling machine such as a $CO_2$ laser or a UV-YAG layer. Laser beams are emitted toward the upper surface 113a of the magnetic layer 113 to form the openings 113X extending through the magnetic layer 113. The openings 113X expose the entire part of the wiring portions 111A, the side surfaces of the metal layer 63, and the upper surface of the metal foil 62 located around the wiring portions 111A. As necessary, a desmear process may be performed.

In the step illustrated in FIG. 11B, the insulation layer 115 is formed. The insulation layer 115 covers the upper surface 113a of the magnetic layer 113, the wall surfaces of the openings 113X of the magnetic layer 113, the coil wiring 114P of the wiring layer 114, the wiring portions 111A, the metal layer 63, and the metal foil 62 located around the wiring portions 111A. The material of the insulation layer 115 may be, for example, an organic resin such as an epoxy resin or a polyimide resin or a resin material in which such an organic resin is mixed with a filler such as silica or alumina. The insulation layer 115 is obtained, for example, by vacuum-laminating with a resin film and curing the resin film with application of heat. Alternatively, the insulation layer 115 may be formed by applying a resin paste or liquid and heating the resin.

Figure 12A:
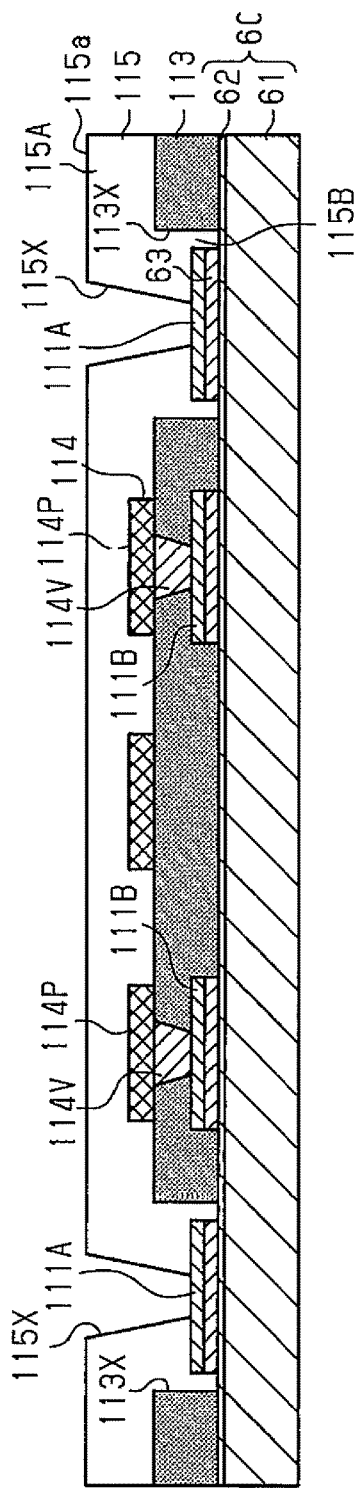

In the step illustrated in FIG. 12A, the openings 115X are formed in the insulation layer 115. The openings 115X may be formed, for example, with a laser drilling machine such as a $CO_2$ laser or a UV-YAG layer. Laser beams are emitted toward the upper surface 115a of the insulation layer 115 to form the openings 115X extending through the insulation layer 115. The openings 115X partially expose the upper surfaces of the wiring portions 111A. As necessary, a desmear process may be performed.

Figure 12B:
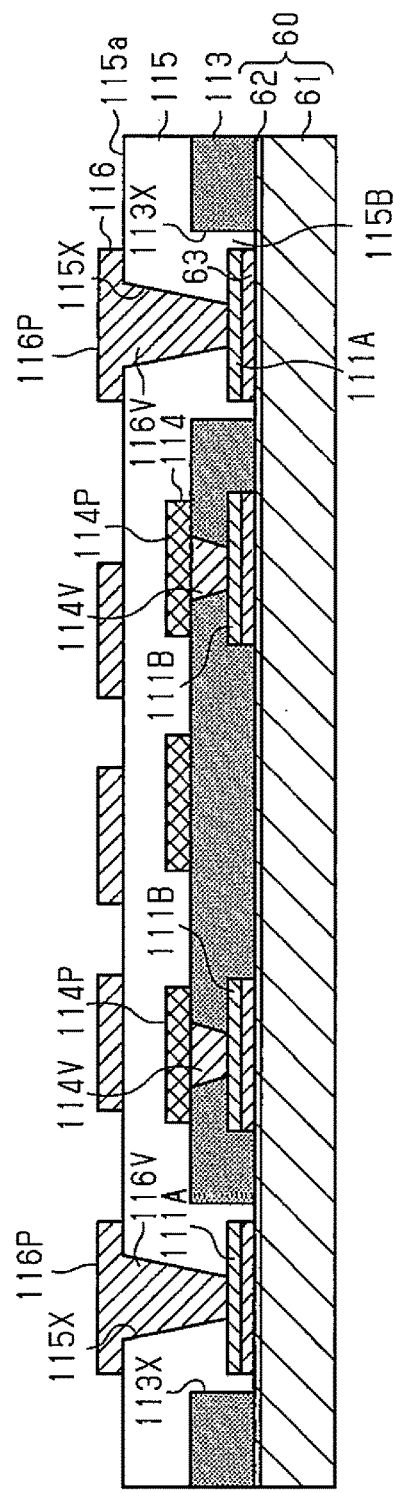

In the step illustrated in FIG. 12B, the wiring layer 116 is formed. A seed layer (not illustrated) is formed on the upper surface 115a of the insulation layer 115, the wall surfaces of the openings 115X of the insulation layer 115, and the upper surfaces of the wiring portions 111A exposed in the openings 115X of the insulation layer 115. The material of the seed layer may be, for example, copper or a copper alloy. The seed layer may be formed through, for example, electroless plating or sputtering. The seed layer is covered by a resist layer (not illustrated) including openings in given locations. The openings are formed in positions corresponding to the wiring portions 116P of the wiring layer 116. The resist layer may be formed from a material having, for example, resistance to plating performed in the next step. Electrolytic plating (electrolytic copper plating) that uses the seed layer as a power feeding electrode is performed to deposit and develop a plating metal on the seed layer exposed in the openings of the resist layer. The resist layer is removed, for example, through asking or with an alkaline stripping solution. Subsequently, the exposed seed layer is removed through etching. This obtains the wiring layer 116.

In the step illustrated in FIG. 13A, the insulation layer 117 including the openings 117X is formed. The upper surface of the insulation layer 115 and the wiring layer 116 are, for example, vacuum-laminated with an epoxy resin film. The resin film is cured by application of heat. This forms the insulation layer 117. Alternatively, the insulation layer 117 may be formed by applying a resin paste or liquid and heating the resin. The openings 117X are formed in the insulation layer 117. The openings 117X may be formed, for example, with a laser drilling machine such as a $CO_2$ laser or a UV-YAG layer. Laser beams are emitted toward the upper surface 117a of the insulation layer 117 to form the openings 117X extending through the insulation layer 117. The openings 117X partially expose the upper surface of the wiring layer 116. As necessary, a desmear process may be performed.

In the step illustrated in FIG. 13B, the wiring layer 118 is formed. A seed layer (not illustrated) is formed on the upper surface of the insulation layer 117, the wall surfaces of the openings 117X of the insulation layer 117, and the upper surface of the wiring layer 116 exposed in the openings 117X of the insulation layer 117. The material of the seed layer may be, for example, copper or a copper alloy. The seed layer may be formed through, for example, electroless plating or sputtering. The seed layer is covered by a resist layer (not illustrated) including openings in given locations. The openings are formed in positions corresponding to the wiring portions 118P of the wiring layer 118. The resist layer may be formed from a material having, for example, resistance to plating performed in the next step. Electrolytic plating (electrolytic copper plating) that uses the seed layer as a power feeding electrode is performed to deposit and develop a plating metal on the seed layer exposed in the openings of the resist layer. The resist layer is removed, for example, through asking or with an alkaline stripping solution. Subsequently, the exposed seed layer is removed through etching. This obtains the wiring layer 118.

Figure 14A:
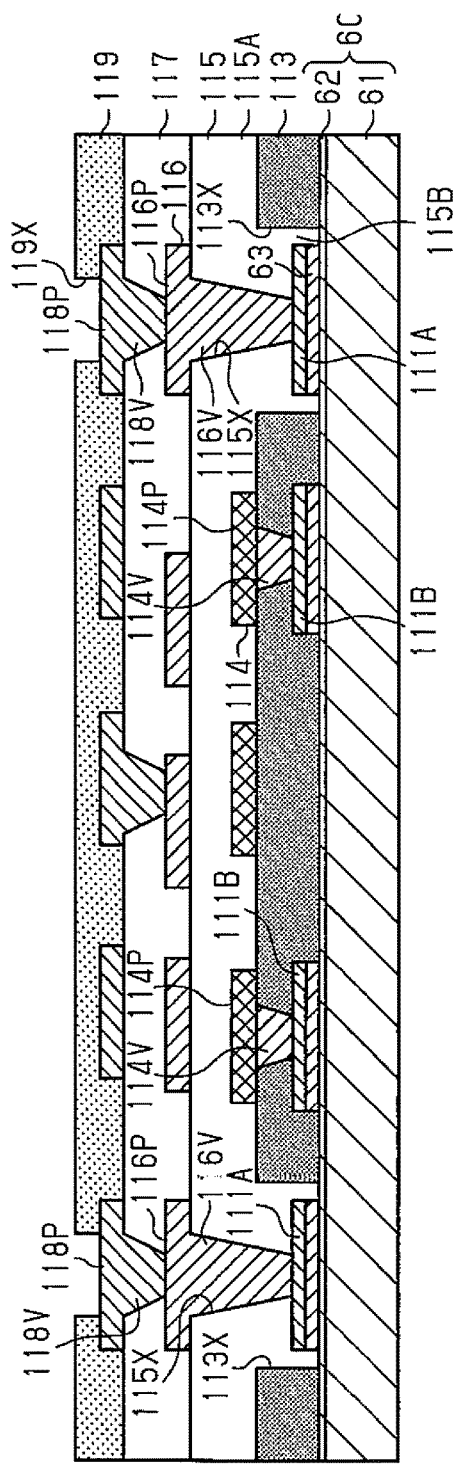

In the step illustrated in FIG. 14A, the solder resist layer 119 including the openings 119X is formed. The solder resist layer 119 is obtained, for example, by laminating with a photosensitive solder resist film or applying a liquid solder resist and exposing and developing the resist through photolithography to be patterned in a desired shape.

Figure 14B:
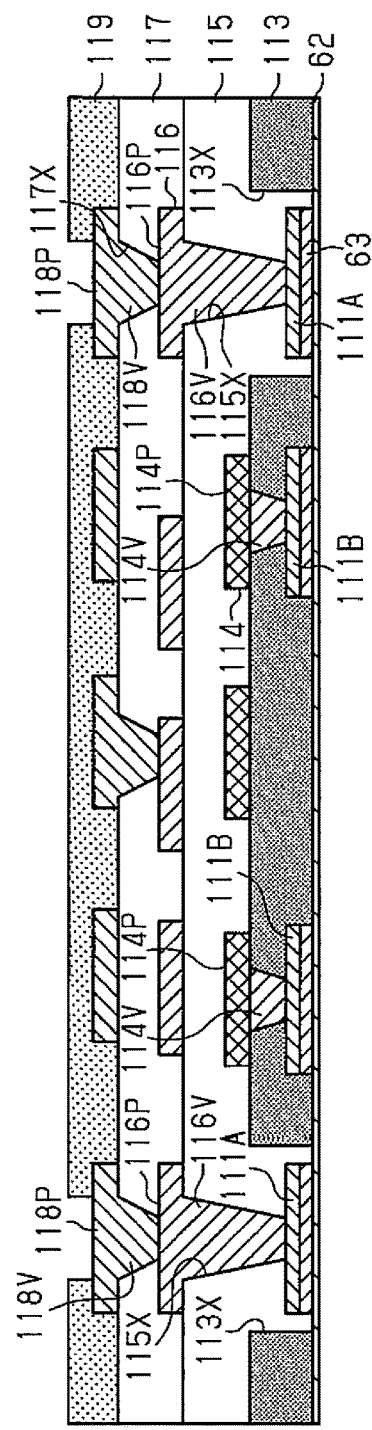

In the step illustrated in FIG. 14B, the carrier plate 61 illustrated in FIG. 14A is removed. The carrier plate 61 is delaminated from the metal foil 62 of the support substrate 60. The delamination layer located between the carrier plate 61 and the metal foil 62 helps delaminate the carrier plate 61. Then, the metal foil 62 and the metal layer 63 are removed. The metal foil 62 and the metal layer 63 are removed, for example, through wet etching that uses a hydrogen peroxide/sulfuric acid solution, a sodium persulfate solution, or an ammonium persulfate solution. At this time, the etching time is controlled so that the wiring portions 111A and 111B remain. When the wiring portions 111A and 111B include a first metal layer (e.g., Ni) and a second metal layer (e.g., Cu) as described above, the first metal layer functions as an etching stop layer so that the wiring layer 111 remains. This obtains the wiring substrate 110 illustrated in FIG. 9B.

The second embodiment has the advantages described below.

(2-1) The wiring substrate 110 of the second embodiment includes the line (signal wiring structure) that transmits signals in the wiring substrate 110. In the example illustrated in FIG. 9B, the signal wiring structure of the wiring substrate 110 includes the wiring portions 111A of the wiring layer 111, the via wirings 116V and the wiring portions 116P of the wiring layer 116, and the via wirings 118V and the wiring portions 118P of the wiring layer 118. The magnetic layer 113 is not in direct contact with the signal wiring structure of the wiring substrate 110. Thus, the wiring substrate 110 of the second embodiment has the same advantages as those obtained by the wiring substrate 10 of the first embodiment.

(2-2) The insulation layer 12 of the first embodiment is omitted from the wiring substrate 110 of the second embodiment. Thus, the wiring substrate 110 of the second embodiment is thinner than the wiring substrate 10 of the first embodiment.

Third Embodiment

The third embodiment will now be described. In the third embodiment, the same reference characters are given to those components that are the same as the corresponding components of the embodiments described above. Such components may not be described in detail.

Figures 15A, 15B:
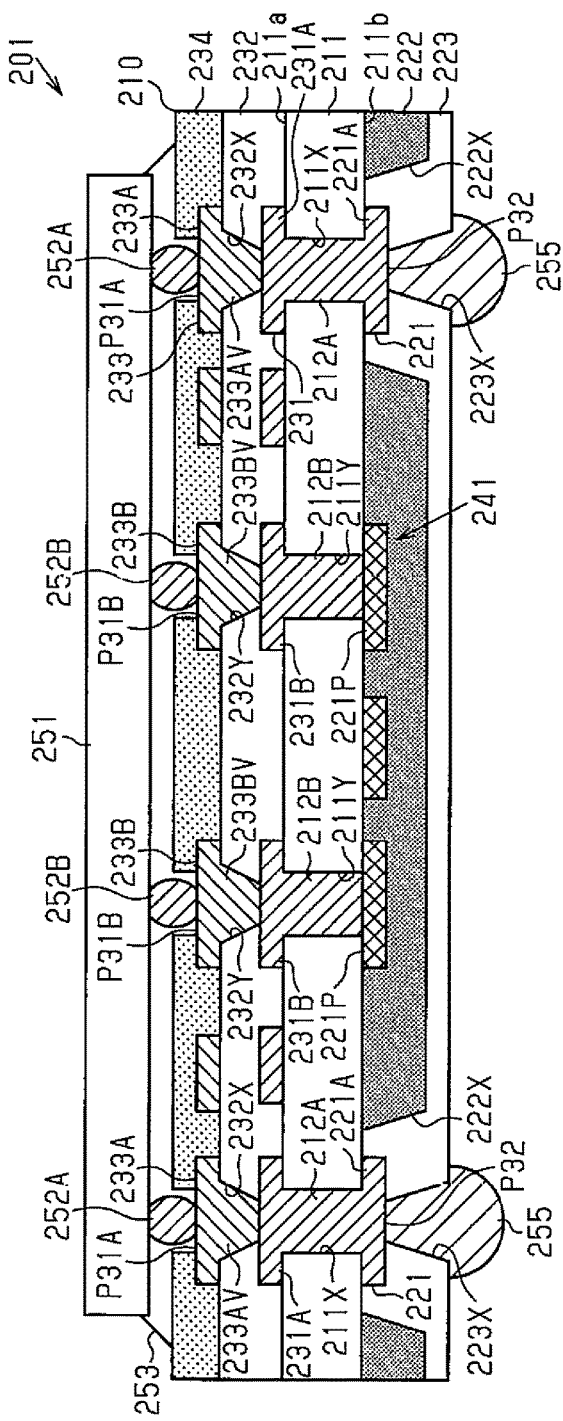
FIG. 15A is a schematically cross-sectional view illustrating a semiconductor device including a third embodiment of a wiring substrate.
FIG. 15B is a schematically cross-sectional view illustrating the wiring substrate of FIG. 15A.

As illustrated in FIG. 15A, a semiconductor device 201 includes a wiring substrate 210 and a semiconductor element 251 mounted on the wiring substrate 210.

The semiconductor element 251 is connected to external connection pads P31A and P31B of the wiring substrate 210 by external connection terminals 252A and 252B. The semiconductor element 251 is flip-chip-connected to the external connection pads P31A and P31B of the wiring substrate 210. The semiconductor element 251 is, for example, a logic chip such as a central processing unit (CPU) or a graphics processing unit (GPU). The external connection terminals 252A and 252B are, for example, solder bumps or gold bumps. The material of the solder bumps is, for example, an alloy containing lead, an alloy of tin and gold, an alloy of tin and copper, an alloy of thin and silver, or an alloy of tin, silver, and copper.

An underfill resin 253 is formed between the semiconductor element 251 and the wiring substrate 210. The material of the underfill resin 253 may be, for example, an insulative resin such as an epoxy resin.

The wiring substrate 210 includes external connection pads P32. The external connection pads P32 are exposed from the lower surface of the wiring substrate 210. The external connection pads P32 are connected to external connection terminals 255. The external connection terminals 255 are used to mount the wiring substrate 210 on, for example, a mount board such as a motherboard. The external connection terminals 255 are, for example, solder bumps. The material of the solder bumps may be, for example, an alloy containing lead (Pb), an alloy of Sn and Cu, an alloy of Sn and silver (Ag), or an alloy of Sn, Ag, and Cu. The external connection terminals 255 may be solder balls or lead pins.

The semiconductor element 251, which is mounted on the wiring substrate 210, sends signals to the external connection pads P31A and receives signals from the external connection pads P31A. The wiring substrate 210 transmits signals between the external connection pads P31A and the external connection pads P32. The wiring substrate 210 includes a conductor (signal wiring structure) arranged between the external connection pads P31A and the external connection pads P32 to transmit signals. The signal wiring structure of the wiring substrate 210 transmits a signal output from the semiconductor element 251 through the external connection pads P31A to the external connection pads P32. The signal is provided to the mount board via the external connection terminals 255, which are connected to the external connection pads P32. Also, when receiving a signal output from the mount board via the external connection terminals 255, the signal wiring structure of the wiring substrate 210 transmits the signal from the external connection pads P32 to the external connection pads P31A. The signal is transmitted to the semiconductor element 251 via the external connection terminals 252A, which are connected to the external connection pads P31A.

The wiring substrate 210 incorporates a coil 241. In the third embodiment, the coil 241 is connected to the external connection pads P31B of the wiring substrate 210. The external connection pads P31B are connected to the semiconductor element 251. Thus, in the third embodiment, the coil 241 of the wiring substrate 210 is connected to the semiconductor element 251.

As illustrated in FIG. 15B, the wiring substrate 210 includes a core substrate 211. The core substrate 211 is located substantially in the middle of the wiring substrate 210 in the thickness-wise direction. The core substrate 211 includes through holes 211X and 211Y extending through the core substrate 211 from an upper surface 211*a* to a lower surface 211*b* in give locations. Through electrodes 212A and 212B are formed in the through holes 211X and 211Y.

The material of the core substrate 211 may be, for example, a glass-epoxy resin obtained by impregnating a glass cloth (glass woven cloth), which functions as a reinforcement material, with a thermosetting insulative resin, the main component of which is an epoxy resin, and curing the resin. The reinforcement material is not limited to a glass cloth and may be, for example, a glass non-woven cloth, an aramid woven cloth, an aramid non-woven cloth, a liquid crystal polymer (LCP) woven cloth, or an LCP non-woven cloth. The thermosetting insulative resin is not limited to an epoxy resin and may be, for example, a resin material such as a polyimide resin or a cyanate resin. The material of the through electrodes 212A and 212B may be, for example, copper (Cu) or a Cu alloy.

The wiring substrate 210 includes a wiring layer 221, a magnetic layer 222, and an insulation layer 223 at the side of the lower surface 211*b* of the core substrate 211. The wiring substrate 210 further includes a wiring layer 231, an insulation layer 232, and a wiring layer 233 at the side of the upper surface 211*a* of the core substrate 211.

The wiring layer 221 is formed on the lower surface 211*b* of the core substrate 211. The wiring layer 221 includes wiring portions 221A and a coil wiring 221P, which is included in the coil 241. The coil wiring 221P of the third embodiment is a planar coil spirally formed on the lower surface 211*b* of the core substrate 211. The two opposite ends of the coil wiring 221P are connected to the through electrodes 212B. The wiring portions 221A are connected to the through electrodes 212A. The material of the wiring layer 221 may be, for example, Cu or a Cu alloy.

The magnetic layer 222 is formed on the lower surface 211*b* of the core substrate 211 to cover the coil wiring 221P of the wiring layer 221. The magnetic layer 222 includes openings 222X, which expose the wiring portions 221A of the wiring layer 221. The openings 222X expose the lower surface 211*b* of the core substrate 211 located around the wiring portions 221A. The magnetic layer 222 may be formed from a magnetic material in which a magnetic filler is mixed with an insulative resin. The insulative resin may be, for example, an epoxy resin or a polyimide resin. The magnetic filler may be, for example, manganese (Mn)-zinc (Zn) ferrite, Ni—Zn ferrite, an iron (Fe)-cobalt (Co) alloy, or an Fe-silicon (Si) alloy.

The insulation layer 223 covers a lower surface 222*b* of the magnetic layer 222 and the wall surfaces of the openings 222X of the magnetic layer 222. The insulation layer 223 also covers part of the wiring portions 221A of the wiring layer 221 located inward from the openings 222X of the magnetic layer 222 and the lower surface 211*b* of the core substrate 211 located around the wiring portions 221A. The insulation layer 223 includes openings 223X, which partially expose lower surfaces 221Ab of the wiring portions 221A of the wiring layer 221 inward from the openings 222X of the magnetic layer 222. The openings 223X partially expose the lower surfaces 221Ab of the wiring portions 221A as the external connection pads P32. The material of the insulation layer 223 may be, for example, an insulative resin, the main component of which is a photosensitive resin such as a phenol resin or a polyimide resin, or a thermosetting insulative resin, the main component of which is an epoxy resin. The insulative resin may contain, for example, a filler such as silica or alumina.

In FIG. 15A, the lower surfaces of the wiring portions 221A partially exposed by the openings 223X serve as the external connection pads P32. Instead, a wiring layer including via wirings filling the openings 223X and wiring portions connected to the wiring portions 221A by the via wirings may be formed on the lower surface of the insulation layer 223. Further, an additional insulation layer and an additional wiring layer may be stacked at the lower surface side of the insulation layer 223. In this structure, the lower surface of the lowermost wiring layer may be used as the external connection pads. Additionally, the lowermost wiring layer may be partially covered by a solder resist layer.

The wiring layer 231 is formed on the upper surface 211*a* of the core substrate 211. The wiring layer 231 includes wiring portions 231A and 231B. The wiring portions 231A are connected via the through electrodes 212A to the wiring portions 221A, which are located on the lower surface 211*b* of the core substrate 211. The wiring portions 231B are connected via the through electrodes 212B to the coil wiring 221P, which is located on the lower surface 211*b* of the core substrate 211. The material of the wiring layer 231 may be, for example, Cu or a Cu alloy.

The insulation layer 232 is formed on the upper surface 211*a* of the core substrate 211 to cover the wiring layer 231. The insulation layer 232 includes openings 232X and 232Y, which partially expose the upper surface of the wiring layer 231. The openings 232X partially expose the upper surfaces of the wiring portions 231A of the wiring layer 231. The openings 232Y partially expose the upper surfaces of the wiring portions 231B of the wiring layer 231. The material of the insulation layer 232 may be, for example, an insulative resin, the main component of which is a photosensitive resin such as a phenol resin or a polyimide resin, or a thermosetting insulative resin, the main component of which is an epoxy resin. The insulative resin may contain, for example, a filler such as silica or alumina.

The wiring layer 233 is formed on an upper surface 232*a* of the insulation layer 232. The wiring layer 233 includes wiring portions 233A and 233B, which are formed on the upper surface 232*a* of the insulation layer 232, and via wirings 233AV and 233BV, which are formed in the openings 232X and 232Y of the insulation layer 232. The via wirings 233AV connect the wiring portions 233A of the wiring layer 233 to the wiring portions 231A of the wiring layer 231. The via wirings 233BV connect the wiring portions 233B of the wiring layer 233 to the wiring portions 231B of the wiring layer 231. The material of the wiring layer 233 may be, for example, Cu or a Cu alloy.

A solder resist layer 234 is formed on the upper surface 232a of the insulation layer 232. The solder resist layer 234 covers the upper surface 232a of the insulation layer 232 and part of the wiring layer 233. The solder resist layer 234 includes openings 234X, which partially expose the upper surfaces of the wiring portions 233A of the wiring layer 233 as the external connection pads P31A, and openings 234Y, which partially expose the upper surfaces of the wiring portions 233B of the wiring layer 233 as the external connection pads P31B. The material of the solder resist layer 234 may be, for example, an insulative resin such as an epoxy resin or an acrylic resin.

As necessary, an OSP process may be performed on the upper surface of the wiring layer 233 exposed from the openings 234X and 234Y of the solder resist layer 234 to form an OSP film. Also, a metal layer may be formed on the upper surface of the wiring portions 233A and 233B exposed from the openings 234X and 234Y. The metal layer is, for example, an Au layer, a Ni layer/Au layer (metal layer in which Au layer is formed on Ni layer that serves as bottom layer), or a Ni layer/Pd layer/Au layer (metal layer in which Ni layer serves as bottom layer, and Ni layer, Pd layer, and Au layer are sequentially stacked). The wiring portions 233A and 233B (or OSP film or metal layer formed on wiring portions 233A and 233B) exposed from the openings 234X and 234Y may be used as the external connection pads P31A and P31B.

Manufacturing Steps

The steps of manufacturing the wiring substrate 210 of the third embodiment will now be described.

Figure 16A:
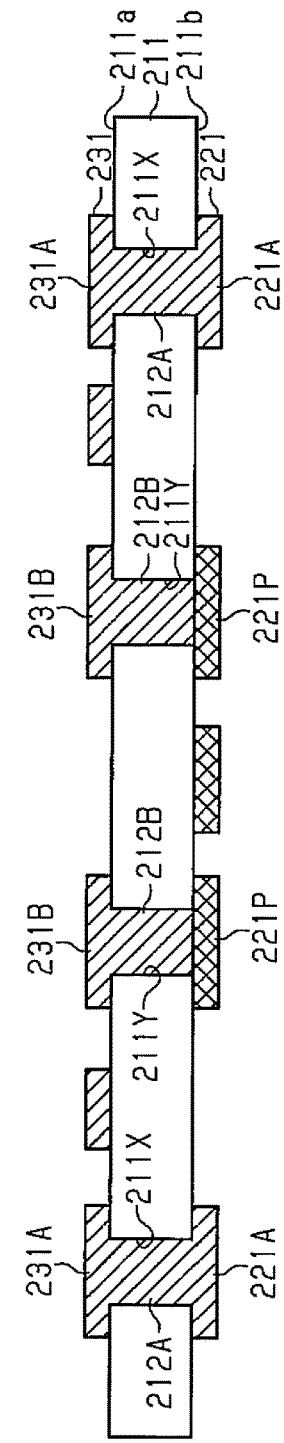

As illustrated in FIG. 16A, the core substrate 211 is prepared. The core substrate 211 may be, for example, a copper clad laminate (CCL). The through holes 211X and 211Y are formed in the core substrate 211. The through electrodes 212A and 212B are formed in the through holes 211X and 211Y, for example, through electrolytic plating or conductive paste filling. Subsequently, the wiring layers 221 (221A, 221P) and 231 (231A, 231B) are formed through a subtractive process.

Figure 16B:
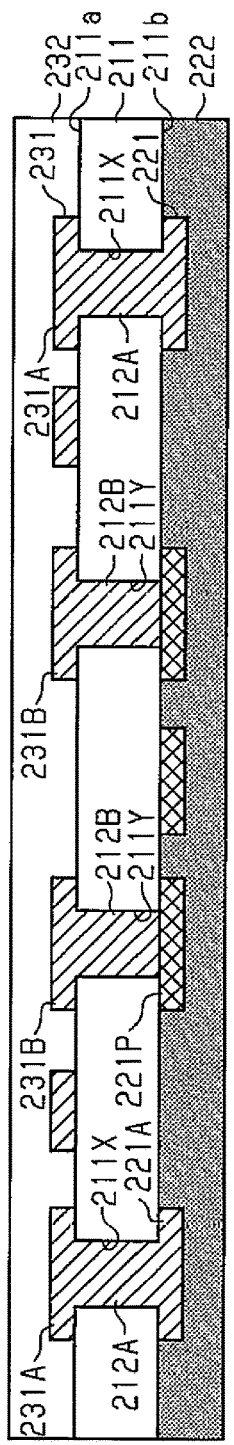

In the step illustrated in FIG. 16B, the magnetic layer 222 and the insulation layer 232 are formed. The magnetic layer 222 is formed to cover the lower surface 211b of the core substrate 211 and the wiring layer 221. The magnetic layer 222 may be, for example, an uncured film formed from a magnetic material in which a magnetic filler is mixed with an insulative resin. The magnetic layer 222 is obtained, for example, by vacuum-laminating a film of a magnetic material and curing the film with application of heat. Additionally, the insulation layer 232 is formed to cover the upper surface 211a of the core substrate 211 and the wiring layer 231. The material of the insulation layer 232 may be, for example, an organic resin such as an epoxy resin or a polyimide resin or a resin material in which such an organic resin is mixed with a filler such as silica or alumina. The insulation layer 232 is obtained, for example, by vacuum-laminating with a resin film and curing the resin film with application of heat. Alternatively, the insulation layer 232 may be formed by applying a resin paste or liquid and heating the resin.

Figure 16C:
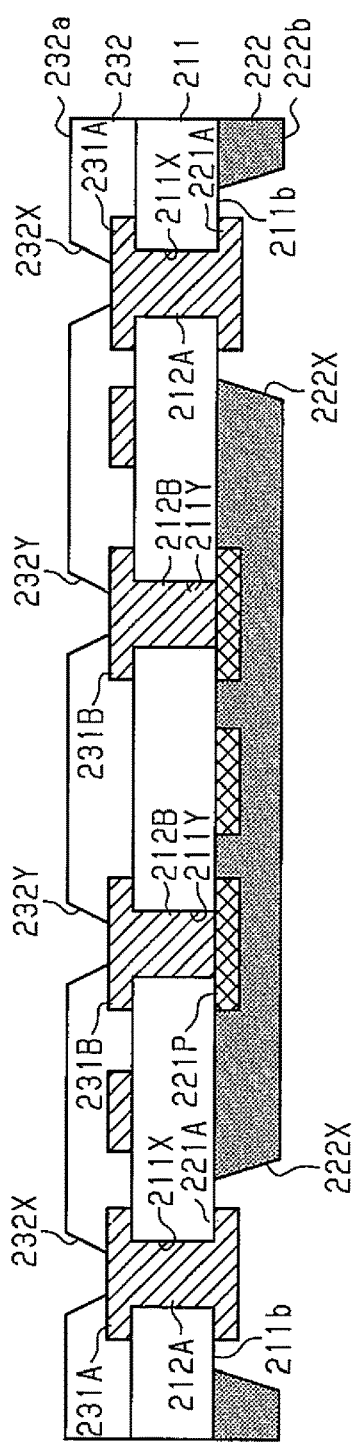

In the step illustrated in FIG. 16C, the openings 222X are formed in the magnetic layer 222, and the openings 232X and 232Y are formed in the insulation layer 232. The openings 222X may be formed, for example, with a laser drilling machine such as a $CO_2$ laser or a UV-YAG layer. Laser beams are emitted toward the lower surface 222b of the magnetic layer 222 to form the openings 222X extending through the magnetic layer 222. The openings 222X expose the entire part of the wiring portions 221A and the lower surface 211b of the core substrate 211 located around the wiring portions 221A. As necessary, a desmear process may be performed. Laser beams are also emitted toward the upper surface 232a of the insulation layer 232 to form the openings 232X and 232Y extending through the insulation layer 232. The openings 232X and 232Y partially expose the upper surfaces of the wiring portions 231A and 231B. As necessary, a desmear process may be performed.

In the step illustrated in FIG. 17A, the insulation layer 223 is formed to cover the magnetic layer 222. The material of the insulation layer 223 may be, for example, an organic resin such as an epoxy resin or a polyimide resin or a resin material in which such an organic resin is mixed with a filler such as silica or alumina. The insulation layer 223 is obtained, for example, by vacuum-laminating with a resin film and curing the resin film with application of heat. Alternatively, the insulation layer 223 may be formed by applying a resin paste or liquid and heating the resin.

In the step illustrated in FIG. 17B, the wiring layer 233 is formed on the upper surface of the insulation layer 232. The wiring layer 233 includes the via wirings 233AV and 233BV, which are formed in the openings 232X and 232Y of the insulation layer 232, and the wiring portions 233A and 233B, which are formed on the upper surface 232a of the insulation layer 232. A seed layer (not illustrated) is formed on the upper surface 232a of the insulation layer 232, the wall surfaces of the openings 232X and 232Y of the insulation layer 232, and the upper surface of the wiring layer 231 (upper surfaces of wiring portions 231A and 231B) exposed in the openings 232X and 232Y. The material of the seed layer may be, for example, copper or a copper alloy. The seed layer may be formed through, for example, electroless plating or sputtering.

The seed layer is covered by a resist layer (not illustrated) including openings in given locations. The openings are formed in positions corresponding to the wiring portions 233A and 233B of the wiring layer 233. The resist layer may be formed from a material having, for example, resistance to plating performed in the next step. Electrolytic plating (electrolytic copper plating) that uses the seed layer as a power feeding electrode is performed to deposit and develop a plating metal on the seed layer exposed in the openings of the resist layer. The resist layer is removed, for example, through ashing or with an alkaline stripping solution. Subsequently, the exposed seed layer is removed through etching. This obtains the wiring layer 233 including the via wirings 233AV and 233BV and the wiring portions 233A and 233B.

In the step illustrated in FIG. 18A, the openings 223X are formed in the insulation layer 223. The openings 223X may be formed, for example, with a laser drilling machine such as a $CO_2$ laser or a UV-YAG layer. Laser beams are emitted toward a lower surface 223b of the insulation layer 223 to form the openings 223X located inward from the openings 222X of the magnetic layer 222 and extending through the insulation layer 223. The openings 223X partially expose the lower surfaces of the wiring portions 221A of the wiring layer 221. As necessary, a desmear process may be performed.

In the step illustrated in FIG. 18B, the solder resist layer 234 including the openings 234X and 234Y is formed. The solder resist layer 234 is obtained, for example, by laminating with a photosensitive solder resist film or applying a liquid solder resist and exposing and developing the resist through photolithography to be patterned in a desired shape.

The third embodiment has the advantages described below.

(3-1) The wiring substrate 210 of the third embodiment includes the line (signal wiring structure) that transmits signals in the wiring substrate 210. In the example illustrated in FIG. 15B, the signal wiring structure of the wiring substrate 210 includes the wiring portions 221A of the wiring layer 221, the through electrodes 212A, the wiring portions 231A of the wiring layer 231, and the via wirings 233AV and the wiring portions 233A of the wiring layer 233. The magnetic layer 222 is not in direct contact with the signal wiring structure of the wiring substrate 210. Thus, the wiring substrate 210 of the third embodiment including the core substrate 211 has the same advantages as those obtained by the wiring substrate 10 of the first embodiment.

Fourth Embodiment

A fourth embodiment will now be described. In the fourth embodiment, the same reference characters are given to those components that are the same as the corresponding components of the first embodiment. Such components may not be described in detail.

Figures 19A, 19B:
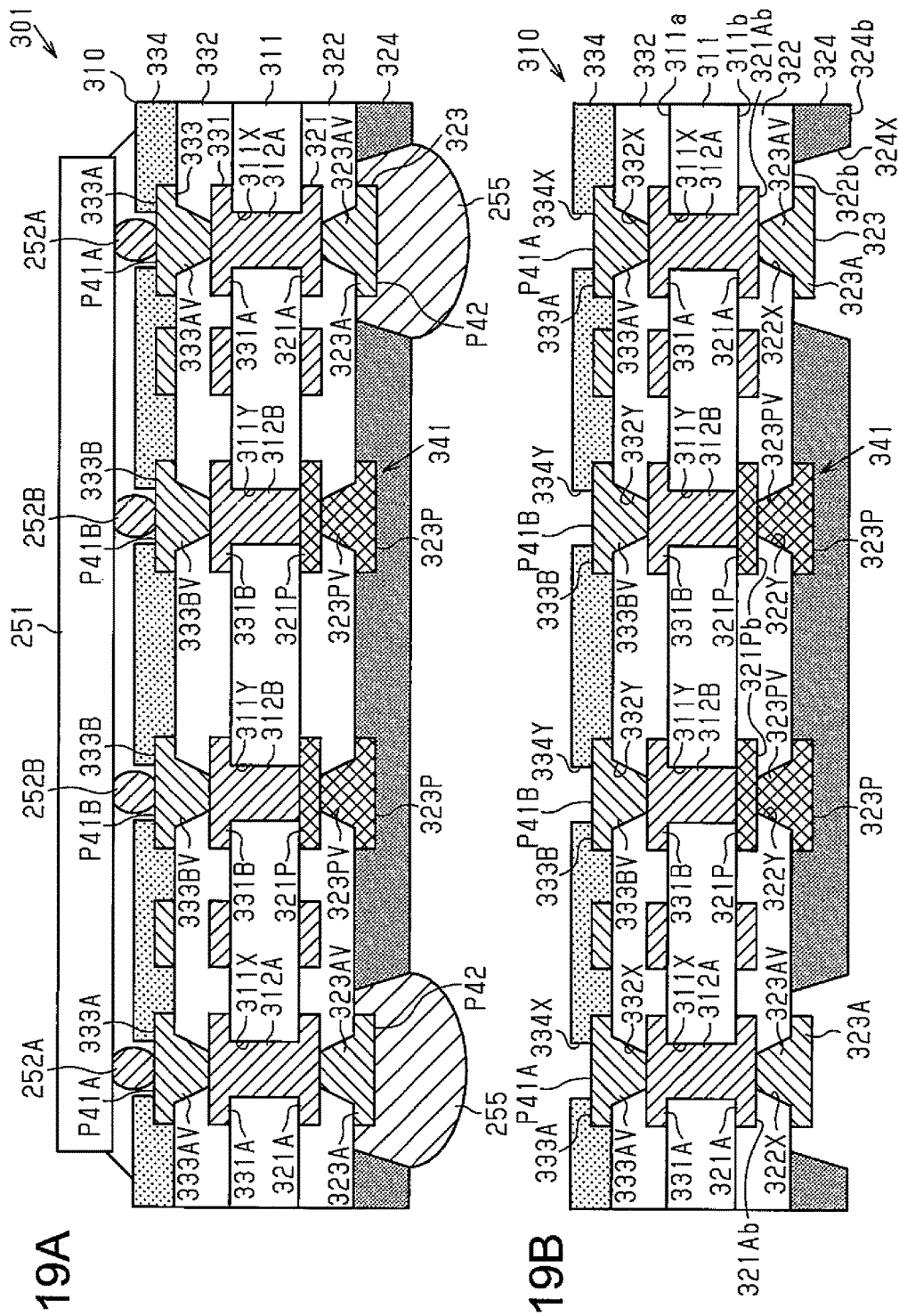
FIG. 19A is a schematically cross-sectional view illustrating a semiconductor device including a fourth embodiment of a wiring substrate.
FIG. 19B is a schematically cross-sectional view illustrating the wiring substrate of FIG. 19A.

As illustrated in FIG. 19A, a semiconductor device 301 includes a wiring substrate 310 and the semiconductor element 251 mounted on the wiring substrate 310.

The semiconductor element 251 is connected to external connection pads P41A and P41B of the wiring substrate 310 by the external connection terminals 252A and 252B. The semiconductor element 251 is flip-chip-connected to the external connection pads P41A and P41B of the wiring substrate 310. The semiconductor element 251 is, for example, a logic chip such as a central processing unit (CPU) or a graphics processing unit (GPU). The external connection terminals 252A and 252B are, for example, solder bumps or gold bumps. The material of the solder bumps may be, for example, an alloy containing lead, an alloy of tin and gold, an alloy of tin and copper, an alloy of tin and silver, or an alloy of tin, silver, and copper.

The underfill resin 253 is formed between the semiconductor element 251 and the wiring substrate 310. The material of the underfill resin 253 may be, for example, an insulative resin such as an epoxy resin.

The wiring substrate 310 includes external connection pads P42. The external connection pads P42 are exposed from the lower surface of the wiring substrate 310. The external connection terminals 255 are connected to the external connection pads P42. The external connection terminals 255 are used to mount the wiring substrate 310 on, for example, a mount board such as a motherboard. The external connection terminals 255 are, for example, solder bumps. The material of the solder bumps may be, for example, an alloy containing lead (Pb), an alloy of Sn and Cu, an alloy of Sn and silver (Ag), or an alloy of Sn, Ag, and Cu. The external connection terminals 255 may be solder balls or lead pins.

The semiconductor element 251, which is mounted on the wiring substrate 310, sends signals to the external connection pads P41A and receives signals from the external connection pads P41A. The wiring substrate 310 transmits signals between the external connection pads P41A and the external connection pads P42. The wiring substrate 310 includes a conductor (signal wiring structure) arranged between the external connection pads P41A and the external connection pads P42 to transmit signals. The signal wiring structure of the wiring substrate 310 transmits a signal output from the semiconductor element 251 through the external connection pads P41A to the external connection pads P42. The signal is provided to the mount board via the external connection terminals 255, which are connected to the external connection pads P42. Also, when receiving a signal output from the mount board via the external connection terminals 255, the signal wiring structure of the wiring substrate 310 transmits the signal from the external connection pads P42 to the external connection pads P41A. The signal is provided to the semiconductor element 251 via the external connection terminals 252A, which are connected to the external connection pads P41A.

The wiring substrate 310 incorporates a coil 341. In the fourth embodiment, the coil 341 is connected to the external connection pads P41B of the wiring substrate 310. The external connection pads P41B are connected to the semiconductor element 251. Thus, in the fourth embodiment, the coil 341 of the wiring substrate 310 is connected to the semiconductor element 251.

As illustrated in FIG. 19B, the wiring substrate 310 includes a core substrate 311. The core substrate 311 is located substantially in the middle of the wiring substrate 310 in the thickness-wise direction. The core substrate 311 includes through holes 311X and 311Y extending through the core substrate 311 from an upper surface 311a to a lower surface 311b in given locations. Through electrodes 312A and 312B are formed in the through holes 311X and 311Y.

The material of the core substrate 311 may be, for example, a glass-epoxy resin obtained by impregnating a glass cloth (glass woven cloth), which functions as a reinforcement material, with a thermosetting insulative resin, the main component of which is an epoxy resin, and curing the resin. The reinforcement material is not limited to a glass cloth and may be, for example, a glass non-woven cloth, an aramid woven cloth, an aramid non-woven cloth, a liquid crystal polymer (LCP) woven cloth, or an LCP non-woven cloth. The thermosetting insulative resin is not limited to an epoxy resin and may be, for example, a resin material such as a polyimide resin or a cyanate resin. The material of the through electrodes 312A and 312B may be, for example, copper (Cu) or a Cu alloy.

The wiring substrate 310 includes a wiring layer 321, an insulation layer 322, a wiring layer 323, and a magnetic layer 324 at the side of the lower surface 311b of the core substrate 311. The wiring substrate 310 further includes a wiring layer 331, an insulation layer 332, and a wiring layer 333 at the side of the upper surface 311a of the core substrate 311.

The wiring layer 321 is formed on the lower surface 311b of the core substrate 311. The wiring layer 321 includes a coil wiring 321P and wiring portions 321A. Two opposite sides of the coil wiring 321P are connected to the through electrodes 312B. The wiring portions 321A are connected to the through electrodes 312A. The material of the wiring layer 321 may be, for example, Cu or a Cu alloy.

The insulation layer 322 is formed on the lower surface 311b of the core substrate 311 to cover the wiring layer 321. The insulation layer 322 includes openings 322Y, which partially expose a lower surface 321Pb of the coil wiring 321P of the wiring layer 321, and openings 322X, which partially expose lower surfaces 321Ab of the wiring portions 321A of the wiring layer 321.

The wiring layer 323 is formed on a lower surface 322b of the insulation layer 322. The wiring layer 323 includes a coil wiring 323P and wiring portions 323A, which are formed on the lower surface 322b of the insulation layer 322, and via wirings 323PV and 323AV, which are formed in the openings 322Y and 322X of the insulation layer 322. The material of the wiring layer 323 may be, for example, Cu or a Cu alloy.

The coil wiring 323P of the wiring layer 323 is connected to the coil wiring 321P of the wiring layer 321 by the via wirings 323PV of the wiring layer 323. The wiring portions 323A of the wiring layer 323 are connected to the wiring portions 321A of the wiring layer 321 by the via wirings 323AV of the wiring layer 323.

The coil wiring 321P of the wiring layer 321, the coil wiring 323P of the wiring layer 323, and the via wirings 323PV of the wiring layer 323 form a helical coil. Thus, the coil 341 of the wiring substrate 310 of the fourth embodiment is formed by the coil wirings 321P and 323P, which are located in two layers, and the via wirings 323PV connecting the coil wirings 321P and 323P.

The magnetic layer 324 is formed on the lower surface 322b of the insulation layer 322 to cover the coil wiring 323P of the wiring layer 323. The magnetic layer 324 includes openings 324X, which expose the wiring portions 323A of the wiring layer 323. The openings 324X expose the lower surface 322b of the insulation layer 322 located around the wiring portions 323A.

The magnetic layer 324 may be formed from a magnetic material in which a magnetic filler is mixed with an insulative resin. The insulative resin may be, for example, an epoxy resin or a polyimide resin. The magnetic filler may be, for example, manganese (Mn)-Zinc (Zn) ferrite, Ni—Zn ferrite, an iron (Fe)-cobalt (Co) alloy, or an Fe-silicon (Si) alloy.

The wiring layer 331 is formed on the upper surface 311a of the core substrate 311. The wiring layer 331 includes wiring portions 331B and 331A. The wiring portions 331B are connected via the through electrodes 312B to the coil wiring 321P, which is located on the lower surface 311b of the core substrate 311. The wiring portions 331A are connected via the through electrodes 312A to the wiring portions 321A, which are located on the lower surface 311b of the core substrate 311. The material of the wiring layer 331 may be, for example, Cu or a Cu alloy.

The insulation layer 332 is formed on the upper surface 311a of the core substrate 311 to cover the wiring layer 331. The insulation layer 332 includes openings 332X and 332Y, which partially expose the upper surface of the wiring layer 331. The openings 332X partially expose the upper surfaces of the wiring portions 331A of the wiring layer 331. The openings 332Y partially expose the upper surfaces of the wiring portions 331B of the wiring layer 331. The material of the insulation layer 332 may be, for example, an insulative resin, the main component of which is a photosensitive resin such as a phenol resin or a polyimide resin, or a thermosetting insulative resin, the main component of which is an epoxy resin. The insulative resin may contain, for example, a filler such as silica or alumina.

The wiring layer 333 is formed on an upper surface 332a of the insulation layer 332. The wiring layer 333 includes wiring portions 333A and 333B, which are formed on the upper surface 332a of the insulation layer 332, and via wirings 333AV and 333BV, which are formed in the openings 332X and 332Y of the insulation layer 332. The via wirings 333AV connect the wiring portions 333A of the wiring layer 333 to the wiring portions 331A of the wiring layer 331. The via wirings 333BV connect the wiring portions 333B of the wiring layer 333 to the wiring portions 331B of the wiring layer 331. The material of the wiring layer 333 may be, for example, Cu or a Cu alloy.

A solder resist layer 334 is formed on the upper surface 332a of the insulation layer 332. The solder resist layer 334 covers the upper surface 332a of the insulation layer 332 and part of the wiring layer 333. The solder resist layer 334 includes openings 334X, which partially expose the upper surfaces of the wiring portions 333A of the wiring layer 333 as the external connection pads P41A, and openings 334Y, which partially expose the upper surfaces of the wiring portions 333B of the wiring layer 333 as the external connection pads P41B. The material of the solder resist layer 334 may be, for example, an insulative resin such as an epoxy resin or an acrylic resin.

As necessary, an OSP process may be performed on the upper surfaces of the wiring portions 333A and 333B exposed from the openings 334X and 334Y of the solder resist layer 334 to form an OSP film. Also, a metal layer may be formed on the upper surfaces of the wiring portions 333A and 333B exposed from the openings 334X and 334Y. The metal layer is, for example, an Au layer, a Ni layer/Au layer (metal layer in which Au layer is formed on Ni layer that serves as bottom layer), or a Ni layer/Pd layer/Au layer (metal layer in which Ni layer serves as bottom layer, and Ni layer, Pd layer, and Au layer are sequentially stacked). The wiring portions 333A and 333B (or OSP film or metal layer formed on wiring portions 333A and 333B) exposed from the openings 334X and 334Y may be used as the external connection pads P41A and P41B.

Manufacturing Steps

The steps of manufacturing the wiring substrate 310 of the fourth embodiment will now be described.

In the step illustrated in FIG. 20A, the through electrodes 312A and 312B and the wiring layers 321 and 331 are formed on the core substrate 311. The core substrate 311 may be, for example, a copper clad laminate (CCL). The through holes 311X and 311Y are formed in the core substrate 311. The through electrodes 312A and 312B are formed in the through holes 311X and 311Y, for example, through electrolytic plating or conductive paste filling. Subsequently, the wiring layers 321 and 331 are formed through a subtractive process. The wiring layer 321 includes the wiring portions 321A and the coil wiring 321P. The wiring layer 331 includes the wiring portions 331A and 331B.

In the step illustrated in FIG. 20B, the insulation layer 322 including the openings 322X and 322Y and the insulation layer 332 including the openings 332X and 332Y are formed. The material of the insulation layers 322 and 332 may be, for example, an organic resin such as an epoxy resin or a polyimide resin or a resin material in which such an organic resin is mixed with a filler such as silica or alumina. For example, the lower surface 311b of the core substrate 311 and the wiring layer 321 are laminated with a resin film, and the resin film is cured by application of heat to form the insulation layer 322. In the same manner, the upper surface 311a of the core substrate 311 and the wiring layer 331 are laminated with a resin film, and the resin film is cured by application of heat to form the insulation layer 332.

The openings 322X and 322Y may be formed, for example, with a laser drilling machine such as a $CO_2$ laser or a UV-YAG layer. Laser beams are emitted toward the lower surface 322b of the insulation layer 322 to form the openings 322X and 322Y extending through the insulation layer 322. The openings 322Y partially expose the lower surface of the coil wiring 321P of the wiring layer 321. In the same manner, the openings 322X partially expose the lower surfaces of the wiring portions 321A. As necessary, a desmear process may be performed.

The openings 332X and 332Y may also be formed, for example, with a laser drilling machine such as a $CO_2$ laser or a UV-YAG layer. Laser beams are emitted toward the upper surface 332a of the insulation layer 332 to form the openings 332X and 332Y extending through the insulation layer 332. The openings 332X partially expose the upper surfaces of the wiring portions 331A of the wiring layer 331. In the same manner, the openings 332Y partially expose the upper surfaces of the wiring portions 331B. As necessary, a desmear process may be performed.

Figure 21A:
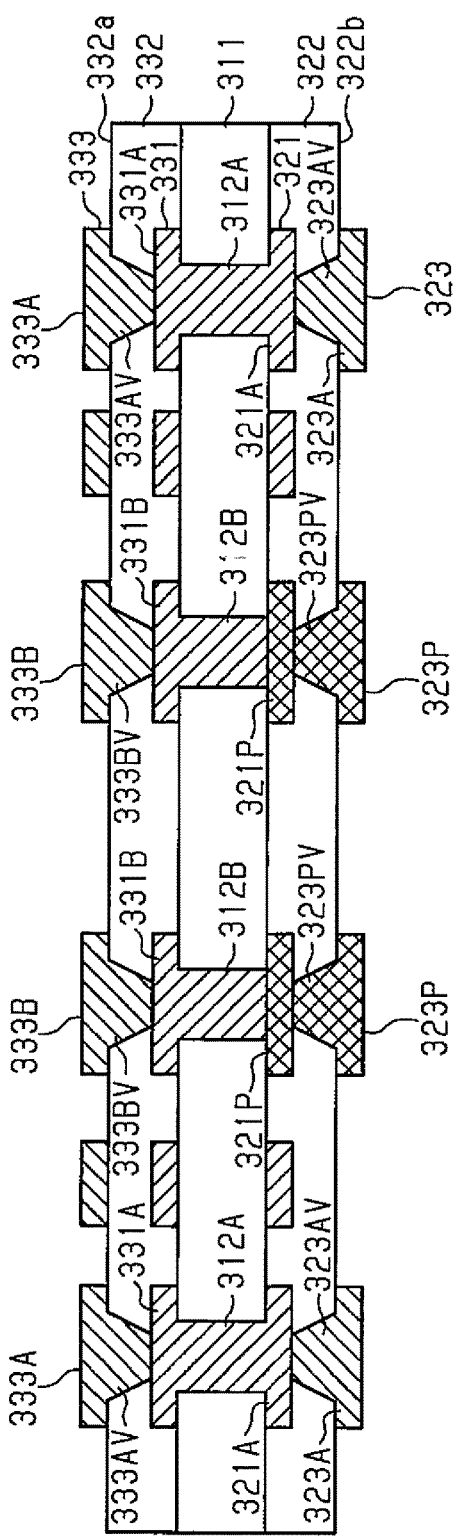

In the step illustrated in FIG. 21A, the wiring layers 323 and 333 are formed. Seed layers (not illustrated) are formed on the surfaces of the insulation layers 322 and 332. In the example illustrated in FIG. 21A, a seed layer is formed on the lower surface of the insulation layer 322, the wall surfaces of the openings 322X and 322Y, and the lower surface of the wiring layer 321 exposed in the openings 322X and 322Y. In the same manner, a seed layer is formed on the upper surface of the insulation layer 332, the wall surfaces of the openings 332X and 332Y, and the upper surface of the wiring layer 331 exposed in the openings 332X and 332Y. The material of the seed layers may be, for example, copper or a copper alloy. The seed layers may be formed through, for example, electroless plating or sputtering.

Each of the seed layers is covered by a resist layer (not illustrated) including openings in given locations. The openings are formed in positions corresponding to the shapes of the wiring layers 323 and 333.

The resist layer may be formed from a material having, for example, resistance to plating performed in the next step. Electrolytic plating (electrolytic copper plating) that uses the seed layers as power feeding electrodes is performed to deposit and develop a plating metal on the seed layers exposed in the openings of the resist layers. The resist layers are removed, for example, through asking or with an alkaline stripping solution. Subsequently, the exposed seed layers are removed through etching. This obtains the wiring layer 323 including the via wirings 323AV and 323PV, the wiring portions 323A, and the coil wiring 323P and also obtains the wiring layer 333 including the via wirings 333AV and 333BV and the wiring portions 333A and 333B.

Figure 21B:
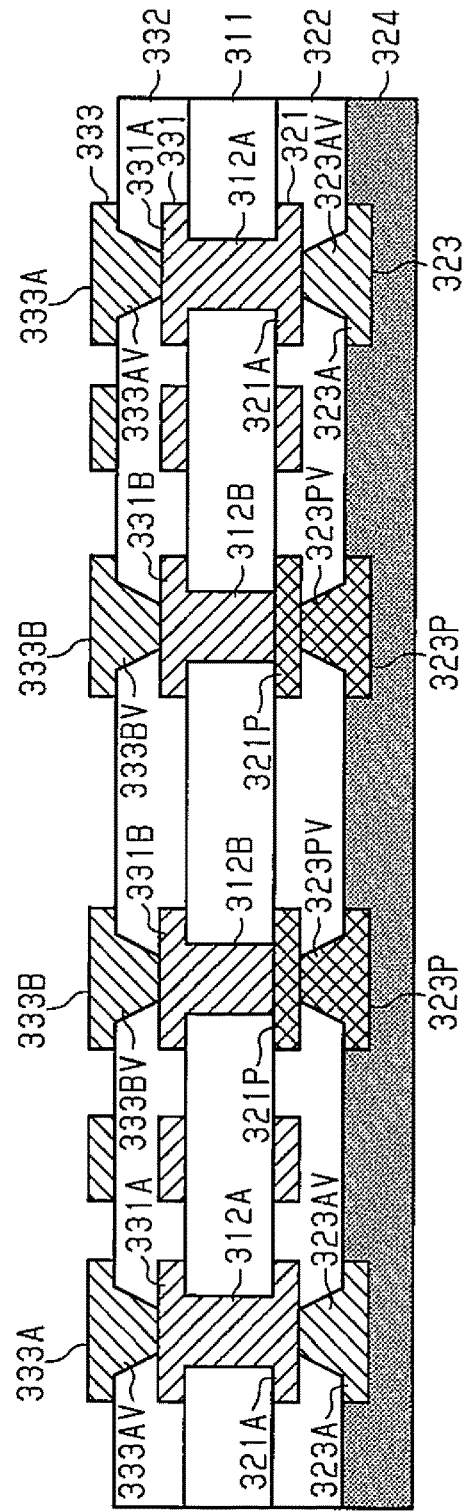

In the step illustrated in FIG. 21B, the magnetic layer 324 is formed to cover the lower surface 322b of the insulation layer 322 and the wiring layer 323. The magnetic layer 324 may be, for example, an uncured film formed from a magnetic material in which a magnetic filler is mixed with an insulative resin. The magnetic layer 324 is obtained, for example, by vacuum-laminating a film of a magnetic material and curing the film with application of heat.

Figures 22A, 22B:
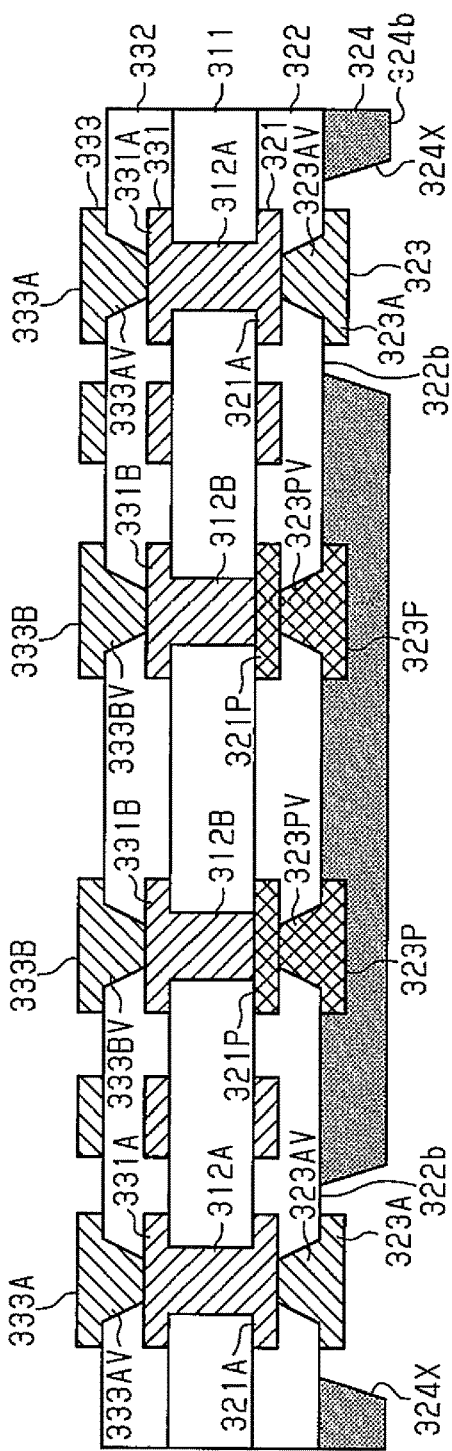

In the step illustrated in FIG. 22A, the openings 324X are formed in the magnetic layer 324. The openings 324X may be formed, for example, with a laser drilling machine such as a $CO_2$ laser or a UV-YAG layer. Laser beams are emitted toward a lower surface 324b of the magnetic layer 324 to form the openings 324X extending through the magnetic layer 324. The openings 324X expose the entire part of the wiring portions 323A of the wiring layer 323 and the lower surface 322b of the insulation layer 322 located around the wiring portions 323A. As necessary, a desmear process may be performed.

In the step illustrated in FIG. 22B, the solder resist layer 334 including the openings 334X, 334Y is formed. The solder resist layer 334 is obtained, for example, by laminating with a photosensitive solder resist film or applying a liquid solder resist and exposing and developing the resist through photolithography to be patterned in a desired shape.

The fourth embodiment has the advantages described below.

(4-1) The wiring substrate 310 of the fourth embodiment includes the line (signal wiring structure) that transmits signals in the wiring substrate 310. In the example illustrated in FIG. 19B, the signal wiring structure of the wiring substrate 310 includes the wiring portions 323A and the via wirings 323AV of the wiring layer 323, the wiring portions 321A of the wiring layer 321, the through electrodes 312A, the wiring portions 331A of the wiring layer 331, and the via wirings 333AV and the wiring portions 333A of the wiring layer 333. The magnetic layer 324 is not in direct contact with the signal wiring structure of the wiring substrate 310. Thus, the wiring substrate 310 of the fourth embodiment including the core substrate 311 has the same advantages as those obtained by the wiring substrate 10 of the first embodiment.

COMPARATIVE EXAMPLE

A comparative example will now be described. In the comparative example, the same reference characters are given to those components that are the same as the corresponding components of the above embodiments. Such components may not be described in detail.

In the comparative example illustrated in FIG. 23, a semiconductor device 401 includes a wiring substrate 410 and the semiconductor element 251 mounted on the wiring substrate 410.

The semiconductor element 251 is connected to the external connection pads P41A and P41B of the wiring substrate 410 by the external connection terminals 252A and 252B. The semiconductor element 251 is flip-chip-connected to the external connection pads P41A and P41B of the wiring substrate 410. The semiconductor element 251 is, for example, a logic chip such as a central processing unit (CPU) or a graphics processing unit (GPU). The external connection terminals 252A and 252B are, for example, solder bumps or gold bumps. The material of solder bumps may be, for example, an alloy containing lead, an alloy of tin and gold, an alloy of tin and copper, an alloy of tin and silver, or an alloy of tin, silver, and copper.

The underfill resin 253 is formed between the semiconductor element 251 and the wiring substrate 410. The material of the underfill resin 253 may be, for example, an insulative resin such as an epoxy resin.

The wiring substrate 410 includes external connection pads P52. The external connection pads P52 are exposed from the lower surface of the wiring substrate 410. The external connection terminals 255 are connected to the external connection pads P52. The external connection terminals 255 are used to mount the wiring substrate 410 on, for example, a mount board such as a motherboard. The external connection terminals 255 are, for example, solder bumps. The material of the solder bumps may be, for example, an alloy containing lead (Pb), an alloy of Sn and Cu, an alloy of Sn and silver (Ag), or an alloy of Sn, Ag, and Cu. The external connection terminals 255 may be solder balls or lead pins.

The semiconductor element 251, which is mounted on the wiring substrate 410, sends signals to the external connection pads P41A and receives signals from the external connection pads P41A. The wiring substrate 410 transmits signals between the external connection pads P41A and the external connection pads P52. The wiring substrate 410 includes a conductor (signal wiring structure) arranged between the external connection pads P41A and the external connection pads P52 to transmit signals. The signal wiring structure of the wiring substrate 410 transmits a signal output from the semiconductor element 251 through the external connection pads P41A to the external connection pads P52. The signal is provided to the mount board via the external connection terminals 255, which are connected to the external connection pads P52. Also, when receiving a signal output from the mount board via the external connection terminals 255, the signal wiring structure of the wiring substrate 410 transmits the signal from the external connection pads P52 to the external connection pads P41A. The signal is provided to the semiconductor element 251 via the external connection terminals 252A, which are connected to the external connection pads P41A.

The wiring substrate 410 incorporates the coil 341. The coil 341 is connected to the external connection pads P41B of the wiring substrate 410. The external connection pads P41B are connected to the semiconductor element 251. Thus, the coil 341 of the wiring substrate 410 is connected to the semiconductor element 251.

As illustrated in FIG. 23B, the wiring substrate 410 includes the core substrate 311. The core substrate 311 is arranged substantially in the middle of the wiring substrate 410 in the thickness-wise direction. The core substrate 311 includes the through holes 311X and 311Y extending through the core substrate 311 from the upper surface 311a to the lower surface 311b in given locations. The through electrodes 312A and 312B are formed in the through holes 311X and 311Y.

The material of the core substrate 311 may be, for example, a glass-epoxy resin obtained by impregnating a glass cloth (glass woven cloth), which functions as a reinforcement material, with a thermosetting insulative resin, the main component of which is an epoxy resin, and curing the resin. The reinforcement material is not limited to a glass cloth and may be, for example, a glass non-woven cloth, an aramid woven cloth, an aramid non-woven cloth, a liquid crystal polymer (LCP) woven cloth, or an LCP non-woven cloth. The thermosetting insulative resin is not limited to an epoxy resin and may be, for example, a resin material such as a polyimide resin or a cyanate resin. The material of the through electrodes 312A and 312B may be, for example, copper (Cu) or a Cu alloy.

The wiring substrate 410 includes the wiring layer 321, the insulation layer 322, the wiring layer 323, and a magnetic layer 424 at the side of the lower surface 311b of the core substrate 311. The wiring substrate 410 further includes the wiring layer 331, the insulation layer 332, and the wiring layer 333 at the side of the upper surface 311a of the core substrate 311.

The wiring layer 321 is formed on the lower surface 311b of the core substrate 311. The wiring layer 321 includes the coil wiring 321P and the wiring portions 321A. Two opposite ends of the coil wiring 321P are connected to the through electrodes 312B. The wiring portions 321A are connected to the through electrodes 312A. The material of the wiring layer 321 may be, for example, Cu or a Cu alloy.

The insulation layer 322 is formed on the lower surface 311b of the core substrate 311 to cover the wiring layer 321. The insulation layer 322 includes the openings 322Y, which partially expose the lower surface 321Pb of the coil wiring 321P of the wiring layer 321, and the openings 322X, which partially expose the lower surfaces 321Ab of the wiring portions 321A of the wiring layer 321.

The wiring layer 323 is formed on the lower surface 322b of the insulation layer 322. The wiring layer 323 includes the coil wiring 323P and the wiring portions 323A, which are formed on the lower surface 322b of the insulation layer 322, and the via wirings 323PV and 323AV, which are formed in the openings 322Y and 322X of the insulation layer 322. The material of the wiring layer 323 may be, for example, Cu or a Cu alloy.

The coil wiring 323P of the wiring layer 323 is connected to the coil wiring 321P of the wiring layer 321 by the via wirings 323PV of the wiring layer 323. The wiring portions 323A of the wiring layer 323 are connected to the wiring portions 321A of the wiring layer 321 by the via wirings 323AV of the wiring layer 323.

The coil wiring 321P of the wiring layer 321, the coil wiring 323P of the wiring layer 323, and the via wirings 323PV of the wiring layer 323 form a helical coil. Thus, the coil 341 of the wiring substrate 410 is formed by the coil wirings 321P and 323P, which are located in two layers, and the via wirings 323PV connecting the coil wirings 321P and 323P.

The magnetic layer 424 is formed on the lower surface 322b of the insulation layer 322 to cover the coil wiring 323P of the wiring layer 323. The magnetic layer 424 includes openings 424X, which partially expose the lower surfaces of the wiring portions 323A of the wiring layer 323.

The material of the magnetic layer 424 may be the same as that of the embodiments described above and be a magnetic material in which a magnetic filler is mixed with an insulative resin. The insulative resin may be, for example, an epoxy resin or a polyimide resin. The magnetic filler may be, for example, manganese (Mn)-Zinc (Zn) ferrite, Ni—Zn ferrite, an iron (Fe)-cobalt (Co) alloy, or an Fe-silicon (Si) alloy.

The wiring layer 331 is formed on the upper surface 311a of the core substrate 311. The wiring layer 331 includes the wiring portions 331B and 331A. The wiring portions 331B are connected via the through electrodes 312B to the coil wiring 321P, which is located on the lower surface 311b of the core substrate 311. The wiring portions 331A are connected via the through electrodes 312A to the wiring portions 321A, which are located on the lower surface 311b of the core substrate 311. The material of the wiring layer 331 may be, for example, Cu or a Cu alloy.

The insulation layer 332 is formed on the upper surface 311a of the core substrate 311 to cover the wiring layer 331. The insulation layer 332 includes the openings 332X and 332Y, which partially expose the upper surface of the wiring layer 331. The openings 332X partially expose the upper surfaces of the wiring portions 331A of the wiring layer 331. The openings 332Y partially expose the upper surfaces of the wiring portions 331B of the wiring layer 331. The material of the insulation layer 332 may be, for example, an insulative resin, the main component of which is a photosensitive resin such as a phenol resin or a polyimide resin, or a thermosetting insulative resin, the main component of which is an epoxy resin. The insulative resin may contain, for example, a filler such as silica or alumina.

The wiring layer 333 is formed on the upper surface 332a of the insulation layer 332. The wiring layer 333 includes the wiring portions 333A and 333B, which are formed on the upper surface 332a of the insulation layer 332, and the via wirings 333AV and 333BV, which are formed in the openings 332X and 332Y of the insulation layer 332. The via wirings 333AV connect the wiring portions 333A of the wiring layer 333 to the wiring portions 331A of the wiring layer 331. The via wirings 333BV connect the wiring portions 333B of the wiring layer 333 to the wiring portions 331B of the wiring layer 331. The material of the wiring layer 333 may be, for example, Cu or a Cu alloy.

The solder resist layer 334 is formed on the upper surface 332a of the insulation layer 332. The solder resist layer 334 covers the upper surface 332a of the insulation layer 332 and part of the wiring layer 333. The solder resist layer 334 includes the openings 334X, which partially expose the upper surfaces of the wiring portions 333A of the wiring layer 333 as the external connection pads P41A, and the openings 334Y, which partially expose the upper surfaces of the wiring portions 333B of the wiring layer 333 as the external connection pads P41B. The material of the solder resist layer 334 may be, for example, an insulative resin such as an epoxy resin or an acrylic resin.

As necessary, an OSP process may be performed on the upper surfaces of the wiring portions 333A and 333B exposed from the openings 334X and 334Y of the solder resist layer 334 to form an OSP film. Also, a metal layer may be formed on the upper surfaces of the wiring portions 333A and 333B exposed from the openings 334X and 334Y. The metal layer is, for example, an Au layer, a Ni layer/Au layer (metal layer in which Au layer is formed on Ni layer that serves as bottom layer), or a Ni layer/Pd layer/Au layer (metal layer in which Ni layer serves as bottom layer, and Ni layer, Pd layer, and Au layer are sequentially stacked).

In the comparative example, the magnetic layer 424 is in direct contact with part of the lower surfaces of the wiring portions 323A of the wiring layer 323 and the side surfaces of the wiring portions 323A of the wiring layer 323. The magnetic layer 424 affects signals transmitted through the signal wiring structure of the wiring substrate 410 and increases the transmission loss as compared to the wiring substrate 310 of the fourth embodiment.

It should be apparent to those skilled in the art that the foregoing embodiments may be implemented in many other specific forms without departing from the scope of this disclosure. Particularly, it should be understood that the foregoing embodiments may be implemented in the following forms.

In the first embodiment, as illustrated in FIG. 1B, the lower surfaces 11Ab, 11Bb of the wiring layer 11 (wiring portions 11A and 11B) are located at higher positions than a lower surface 12b of the insulation layer 12 so that the lower surfaces 11Ab, 11Bb of the wiring layer 11 (wiring portions 11A and 11B) and the openings 12bX and 12bY in the lower surface 12b of the insulation layer 12 form recesses. Instead, the lower surfaces 11Ab, 11Bb of the wiring layer 11 (wiring portions 11A and 11B) may be located at the same position as the lower surface 12b of the insulation layer 12. In the same manner, in the second embodiment, the lower surface of the wiring layer 111 (wiring portions 111A and 111B) may be located at the same position as the lower surfaces of the magnetic layer 113 and the insulation layer 115.

In the first embodiment, a solder resist layer may be formed on the lower surface of the insulation layer 12. In the same manner, in the second embodiment, a solder resist layer may be formed on the lower surface of the magnetic layer 113.

In the first embodiment, the wiring substrate 10 includes the spiral coil wiring 14P of the wiring layer 14 located on the upper surface 13a of the magnetic layer 13. Instead, in the same manner as the fourth embodiment, the wiring substrate 10 may include a helical coil wiring including wiring portions of multiple wiring layers. In the same manner, the wiring substrate 110 of the second embodiment may include a helical coil wiring including wiring portions of multiple wiring layers. Also, the wiring substrate 210 of the third embodiment may include a helical coil wiring including wiring portions of multiple wiring layers.

In the fourth embodiment, the coil is formed by the coil wirings 321P and 323P of the two wiring layers 321 and 323 and the via wirings 323PV connecting the coil wirings 321P and 323P. Instead, a coil may be formed by coil wirings included in three or more wiring layers and via wirings connecting the coil wirings.

In the first embodiment, the wiring substrate 10 may be configured so that the coil wiring 14P of the wiring layer 14 is connected to the semiconductor element 51. In the same manner, the wiring substrate 110 of the second embodiment may be configured so that the coil wiring 114P of the wiring layer 114 is connected to the semiconductor element 51.

In the third embodiment, the wiring substrate 210 may be configured so that the coil wiring 221P of the wiring layer 221 is connected to external connection terminals and so that the coil wiring 221P is connected to the mount board for the wiring substrate 210. In the same manner, the wiring substrate 310 of the fourth embodiment may be configured so that the coil wiring 323P of the wiring layer 323 is connected to external connection terminals and so that the coil wiring 323P is connected the mount board for the wiring substrate 310.

In the first embodiment, the coil wiring 14P may be formed on the lower surface of the magnetic layer 13 so that the magnetic layer 13 is in contact with the upper surface of the coil wiring 14P. For example, the coil wiring 14P illustrated in FIG. 3B is formed on the upper surface 12a of the insulation layer 12 illustrated in FIG. 2C. The magnetic layer 13 is formed to cover the upper surface 12a of the insulation layer 12 and the coil wiring 14P. With such a structure, the L value of the coil is improved.

In the third and fourth embodiments, the order of the steps may be changed.

For example, in the step illustrated in FIG. 16C, the openings 222X of the magnetic layer 222 and the openings 232X of the insulation layer 232 are formed. Instead, after the openings 222X are formed in the magnetic layer 222, the insulation layer 223 illustrated in FIG. 17A may be formed before the openings 232X are formed in the insulation layer 232. Then, after the openings 232X are formed in the insulation layer 232, the wiring layer 233 illustrated in FIG. 17B may be formed.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to an illustration of the superiority and inferiority of the invention. Although embodiments have been described in detail, it should be understood that various changes, substitutions, and alterations could be made hereto without departing from the scope of this disclosure.

The invention claimed is:

1. A wiring substrate comprising:
   a coil wiring;
   a magnetic layer that is in contact with a lower surface of the coil wiring, wherein the magnetic layer includes an opening extending through in a thickness-wise direction;
   a first insulation layer covering the coil wiring, an upper surface of the magnetic layer, and a wall surface of the opening; and
   a signal wiring structure that transmits a signal of a semiconductor element in the wiring substrate when the semiconductor element is mounted on the wiring substrate, wherein the signal wiring structure is formed so that the signal of the semiconductor element travels through the opening of the magnetic layer, wherein the signal wiring structure includes
- a first wiring portion located on an upper surface of the first insulation layer, and
- a first via wiring located inward from the opening of the magnetic layer and connected to the first wiring portion, wherein the first insulation layer includes an opening extending through in the thickness-wise direction and located inward from the opening of the magnetic layer, the first via wiring is filled in the opening of the first insulation layer, the first insulation layer is filled in a gap between the first via wiring and the wall surface of the opening of the magnetic layer, and the magnetic layer is not in contact with the signal wiring structure.

2. The wiring substrate according to claim 1, further comprising a second insulation layer covering a lower surface of the magnetic layer, wherein the signal wiring structure further includes a second wiring portion connected to the first via wiring and embedded in the second insulation layer so that a lower surface of the second wiring portion is exposed.

3. The wiring substrate according to claim 2, further comprising:
- a third wiring portion embedded in the second insulation layer so that a lower surface of the third wiring portion is exposed; and
- a second via wiring connecting the third wiring portion to the coil wiring.

4. The wiring substrate according to claim 1, wherein the signal wiring structure further includes a second wiring portion connected to the first via wiring, wherein the second wiring portion is located inward from the opening of the magnetic layer and embedded in the first insulation layer so that a lower surface of the second wiring portion is exposed.

5. The wiring substrate according to claim 4, further comprising:
- a third wiring portion embedded in the magnetic layer so that a lower surface of the third wiring portion is exposed; and
- a second via wiring connecting the third wiring portion to the coil wiring.

6. The wiring substrate according to claim 1, further comprising a second insulation layer covering a lower surface of the magnetic layer, wherein the signal wiring structure further includes a second wiring portion connected to the first via wiring and embedded in the second insulation layer so that a lower surface of the second wiring portion is exposed, the second insulation layer includes an opening that is continuous with the opening of the magnetic layer and partially exposes an upper surface of the second wiring portion, and the first insulation layer is further filled in a gap between the first via wiring and a wall surface of the opening of the second insulation layer.

7. The wiring substrate according to claim 1, wherein the signal wiring structure further includes a second wiring portion connected to the first via wiring, wherein the second wiring portion is located inward from the opening of the magnetic layer and embedded in the first insulation layer so that a lower surface of the second wiring portion is exposed, and the first insulation layer is further filled in a gap between the wall surface of the opening of the magnetic layer and a side surface of the second wiring portion.

8. A wiring substrate comprising:
- an insulation layer including an upper surface and a lower surface;
- a coil wiring formed on the lower surface of the insulation layer;
- a magnetic layer covering the lower surface of the insulation layer and the coil wiring, wherein the magnetic layer includes an opening extending through in a thickness-wise direction; and
- a signal wiring structure that transmits a signal of a semiconductor element in the wiring substrate when the semiconductor element is mounted on the wiring substrate, wherein the signal wiring structure is formed so that the signal of the semiconductor element travels through the opening of the magnetic layer, wherein the magnetic layer is not in contact with the signal wiring structure.

9. The wiring substrate according to claim 8, wherein
the signal wiring structure includes a wiring portion formed on the lower surface of the insulation layer, and
the opening of the magnetic layer exposes the wiring portion and the lower surface of the insulation layer located around the wiring portion.

10. The wiring substrate according to claim 9, further comprising a second insulation layer covering the lower surface of the magnetic layer, a wall surface of the opening of the magnetic layer, the lower surface of the insulation layer located around the wiring portion, and a part of the wiring portion, wherein the second insulation layer includes an opening exposing a part of a lower surface of the wiring portion.

11. The wiring substrate according to claim 8, further comprising a second coil wiring formed in the upper surface of the insulation layer and connected to the coil wiring to form a helical coil.

12. A semiconductor device comprising:
the wiring substrate according to claim 1; and
the semiconductor element mounted on the wiring substrate.

13. A semiconductor device comprising:
the wiring substrate according to claim 8; and
the semiconductor element mounted on the wiring substrate.

* * * * *